(12) United States Patent
Choi et al.

(10) Patent No.: US 12,058,845 B2
(45) Date of Patent: *Aug. 6, 2024

(54) HIGH POWER SURFACE MOUNT FILTER

(71) Applicant: AVX Corporation, Fountain Inn, SC (US)

(72) Inventors: Kwang Choi, Simpsonville, SC (US); Marianne Berolini, Greenville, SC (US); Michael W. Kirk, Simpsonville, SC (US); Hector Fuentes, Fountain Inn, SC (US); Jonathan C. Herr, Taylors, SC (US); Bryan R. Seither, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/344,059

(22) Filed: Jun. 10, 2021

(65) Prior Publication Data
US 2022/0174848 A1 Jun. 2, 2022

Related U.S. Application Data

(63) Continuation of application No. 16/572,740, filed on Sep. 17, 2019, now Pat. No. 11,071,239.
(Continued)

(51) Int. Cl.
H05K 7/20 (2006.01)
H03H 7/01 (2006.01)
H05K 9/00 (2006.01)

(52) U.S. Cl.
CPC ....... *H05K 7/20918* (2013.01); *H03H 7/0161* (2013.01); *H05K 9/0071* (2013.01)

(58) Field of Classification Search
CPC .................................................. H05K 7/20918
See application file for complete search history.

(56) References Cited

U.S. PATENT DOCUMENTS 5,045,824 A 9/1991 Metroka
5,357,227 A 10/1994 Tonegawa et al.
(Continued)

FOREIGN PATENT DOCUMENTS

CN 206806475 U 12/2017
EP 2 068 393 A1 6/2009
(Continued)

OTHER PUBLICATIONS

International Search Report and Written Opinion for PCT/US2019/051413 dated Jan. 3, 2020, 14 pages.
(Continued)

*Primary Examiner* — Mukundbhai G Patel
(74) *Attorney, Agent, or Firm* — Dority & Manning, P.A.

(57) ABSTRACT

A filter assembly is disclosed that includes a monolithic filter having a surface and a heat sink coupled to the surface of the monolithic filter. The heat sink includes a layer of thermally conductive material that can have a thickness greater than about 0.02 mm. The heat sink may provide electrical shielding for the monolithic filter. In some embodiments, the filter assembly may include an organic dielectric material, such as liquid crystalline polymer or polyphenyl ether. In some embodiments, the filter assembly may include an additional monolithic filter.

18 Claims, 26 Drawing Sheets

Related U.S. Application Data

(60) Provisional application No. 62/732,605, filed on Sep. 18, 2018.

(56) References Cited

U.S. PATENT DOCUMENTS

| | | | |
|---|---|---|---|
| 6,618,267 B1 | 9/2003 | Dalal et al. | |
| 6,720,848 B2 | 4/2004 | Okamura et al. | |
| 6,771,148 B2 | 8/2004 | Okamura et al. | |
| 6,806,567 B2 | 10/2004 | Hembree | |
| 6,852,573 B2 | 2/2005 | Ebihara et al. | |
| 6,958,667 B2 | 10/2005 | Mizoguchi et al. | |
| 6,970,057 B2 | 11/2005 | Lin et al. | |
| 7,061,100 B2 | 6/2006 | Iwaki et al. | |
| 7,098,760 B2 | 8/2006 | Okamura et al. | |
| 7,119,639 B2 | 10/2006 | Okamura et al. | |
| 7,187,109 B2 | 3/2007 | Tikka et al. | |
| 7,239,221 B2 | 7/2007 | Okamura et al. | |
| 7,268,648 B2 | 9/2007 | Okamura et al. | |
| 7,312,676 B2 | 12/2007 | Kundu | |
| 7,439,840 B2 * | 10/2008 | Carastro | H01F 41/041 336/200 |
| 7,696,845 B2 | 4/2010 | Fujinaga et al. | |
| 7,795,995 B2 | 9/2010 | White et al. | |
| 7,830,228 B2 | 11/2010 | Brown et al. | |
| 8,013,688 B2 | 9/2011 | White et al. | |
| 8,106,722 B2 | 1/2012 | Shimamura et al. | |
| 8,237,252 B2 | 8/2012 | Pagaila et al. | |
| 8,669,823 B1 * | 3/2014 | Olsson | H03H 9/02062 331/158 |
| 8,754,726 B2 | 6/2014 | Sasaki et al. | |
| 8,891,241 B2 * | 11/2014 | Chao | H05K 1/0236 257/659 |
| 9,490,768 B2 | 11/2016 | Randall et al. | |
| 9,537,195 B2 | 1/2017 | Sun et al. | |
| 9,601,817 B2 | 3/2017 | Kaesser | |
| 9,812,750 B2 | 11/2017 | Randall et al. | |
| 10,109,903 B2 | 10/2018 | Huang et al. | |
| 10,277,190 B2 | 4/2019 | Masuda et al. | |
| 10,389,329 B2 | 8/2019 | Shiokawa | |
| 2002/0132898 A1 * | 9/2002 | Takaya | H01B 3/442 524/543 |
| 2006/0055489 A1 | 3/2006 | Okamuara et al. | |
| 2009/0033439 A1 | 2/2009 | Igarashi | |
| 2011/0018114 A1 * | 1/2011 | Pagaila | H01L 24/97 257/E23.101 |
| 2012/0068789 A1 * | 3/2012 | Jones | H01T 4/08 333/185 |
| 2013/0009740 A1 | 1/2013 | Chang et al. | |
| 2013/0234819 A1 | 9/2013 | Yoo et al. | |
| 2014/0036533 A1 * | 2/2014 | Smith-Gillespie | G02F 1/133615 362/609 |
| 2017/0155445 A1 * | 6/2017 | Xie | H04B 7/26 |
| 2018/0102578 A1 * | 4/2018 | Huang | H05K 1/0203 |
| 2019/0221448 A1 * | 7/2019 | Bae | H01L 28/40 |
| 2019/0323663 A1 * | 10/2019 | Rudy | F21K 9/69 |
| 2020/0132898 A1 | 4/2020 | Gao et al. | |

FOREIGN PATENT DOCUMENTS

| | | |
|---|---|---|
| JP | 4539422 B2 | 9/2010 |
| JP | 5152192 B2 | 2/2013 |
| WO | WO 2015/048708 | 4/2015 |

OTHER PUBLICATIONS

Dissertation of Seunghyun Eddy Hwang to Georgia Institute of Technology entitled "Characterization and Design of Embedded Passive Circuits for Applications up to Millimeter-Wave Frequency," dated Aug. 2011, 196 pages.

Search Report for CN 201980059616.7 dated Jul. 15, 2021, 3 pages.

* cited by examiner

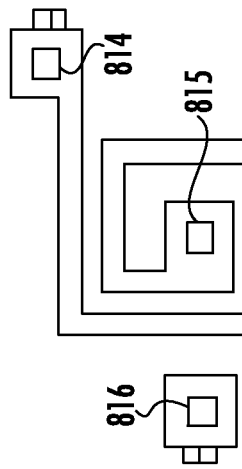
FIG. 3C
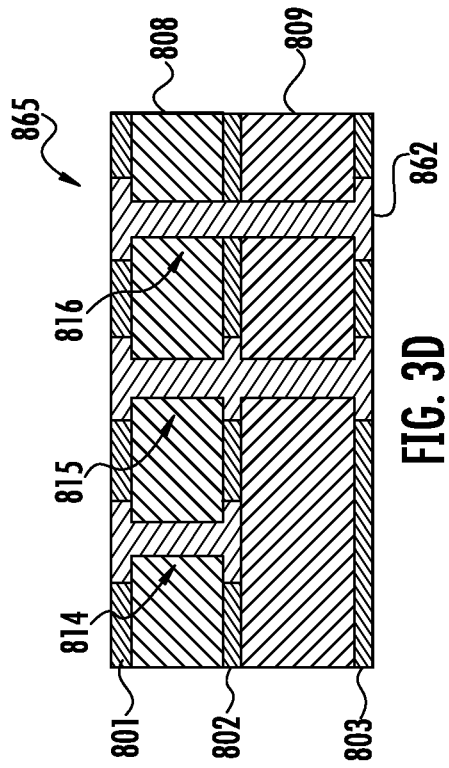
FIG. 3D
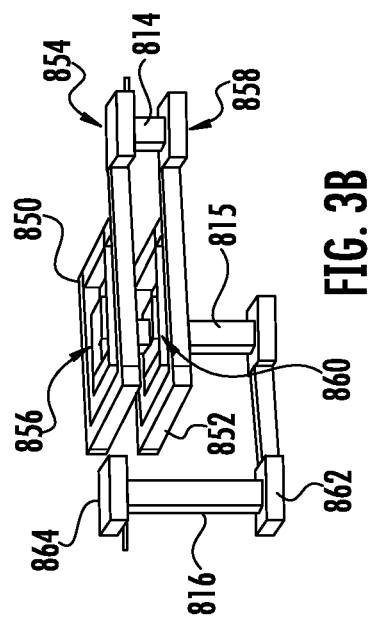
FIG. 3B
FIG. 3A

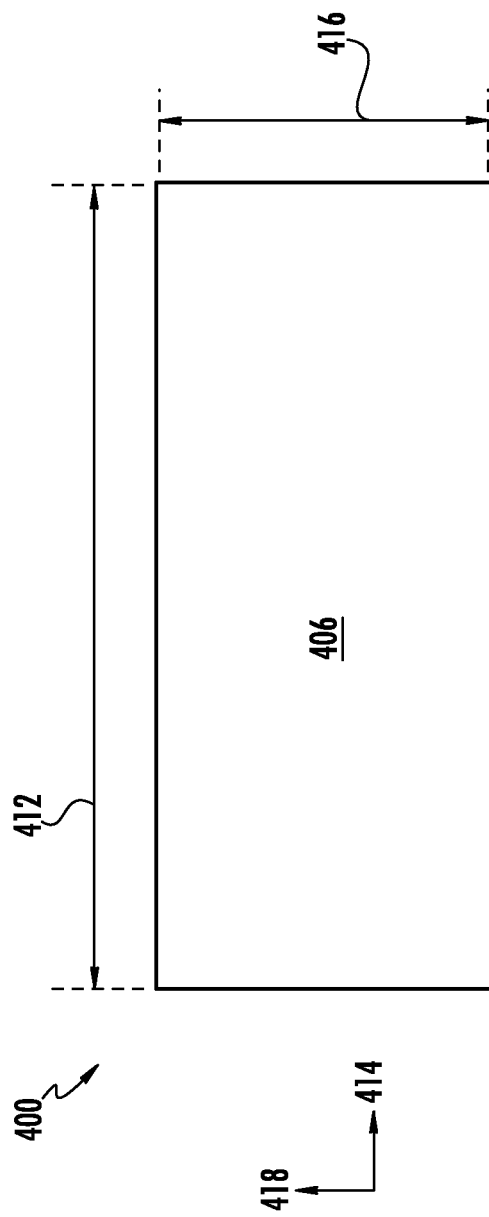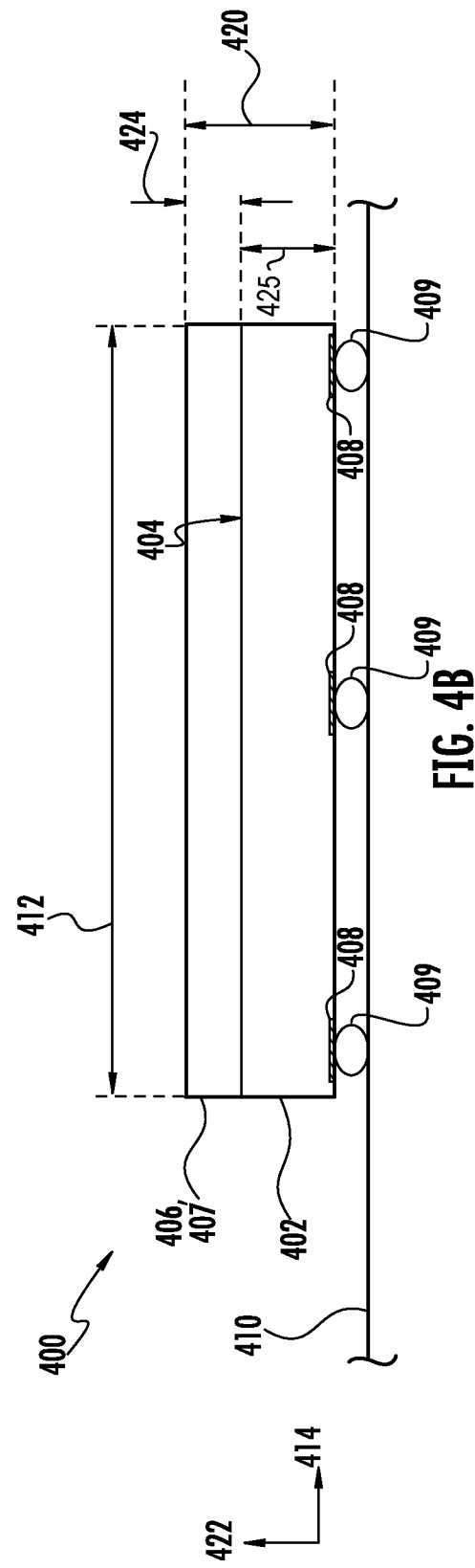
FIG. 4A
FIG. 4B

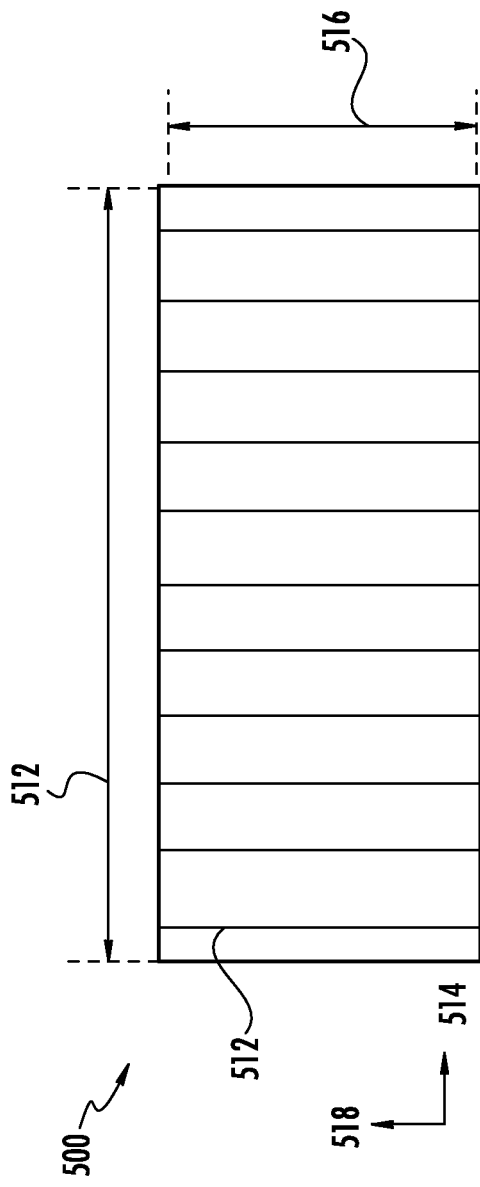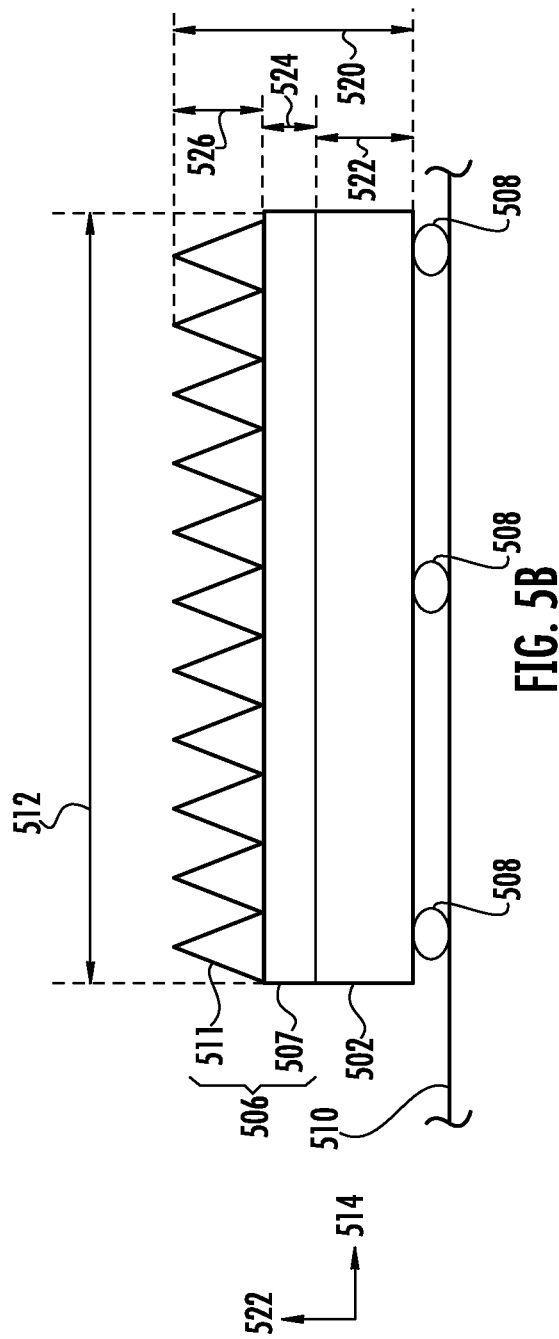

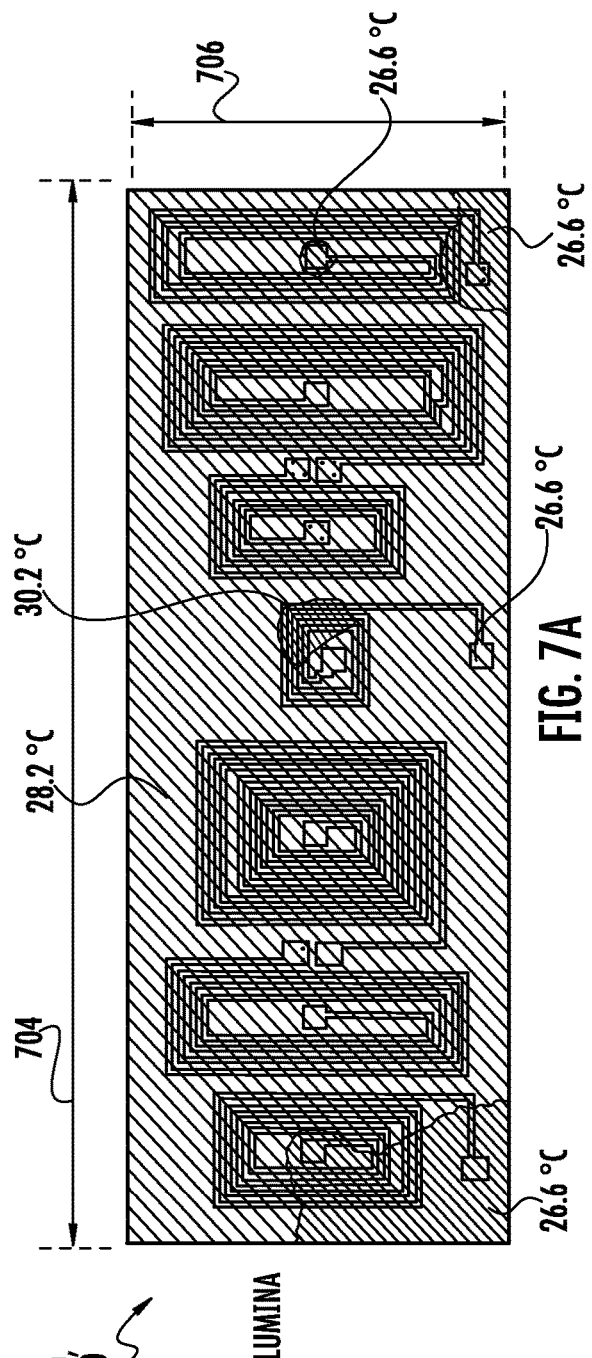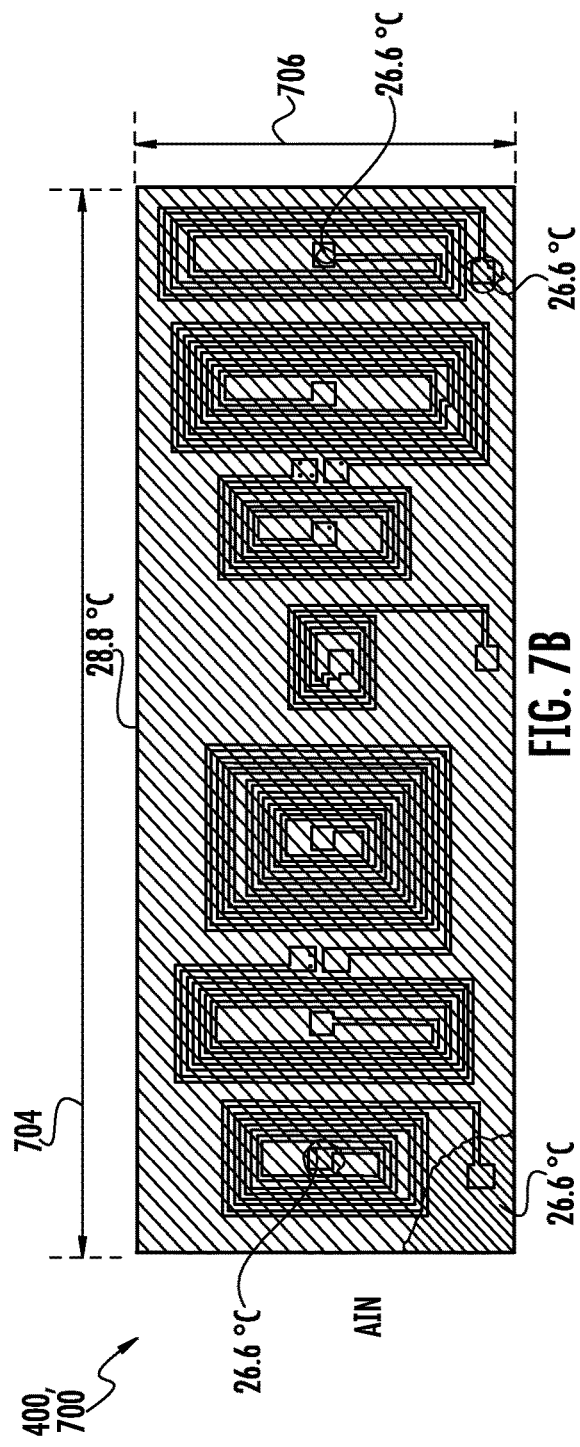

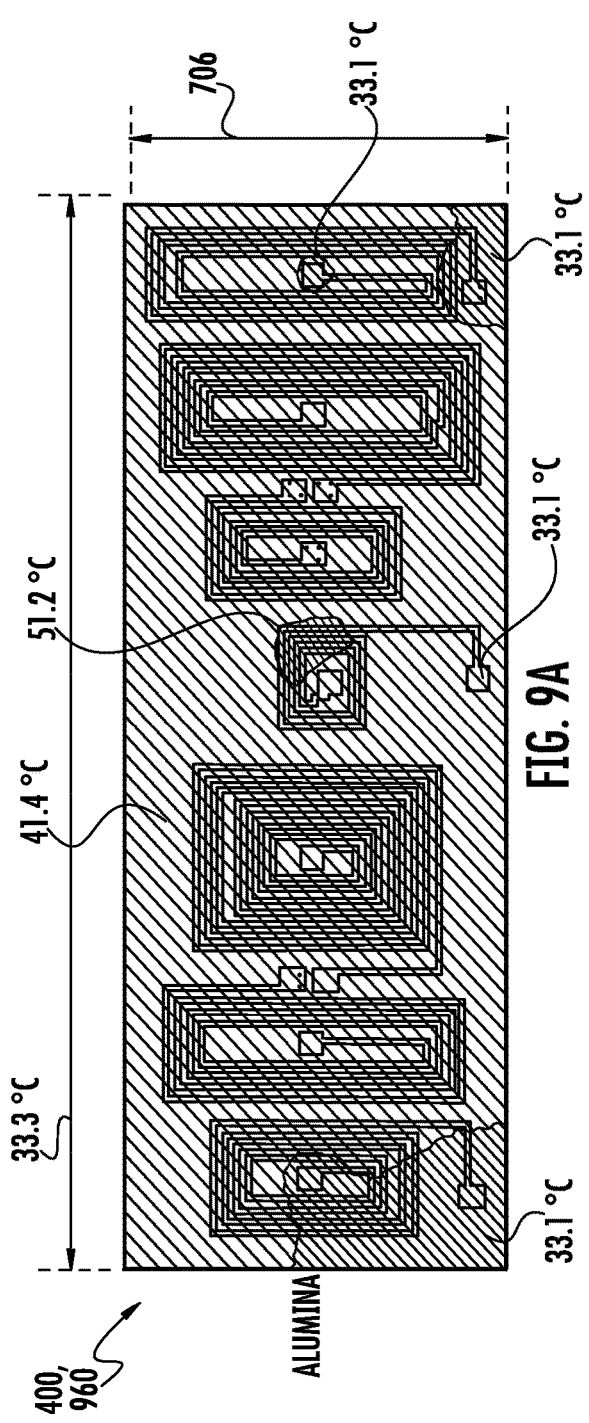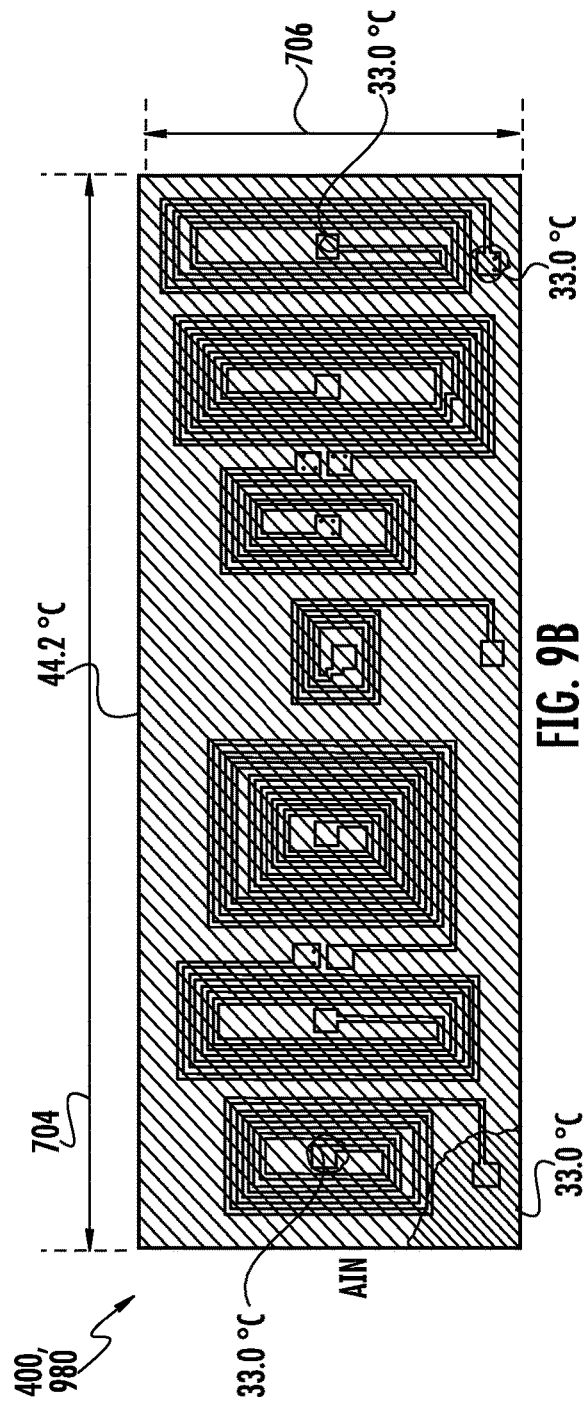

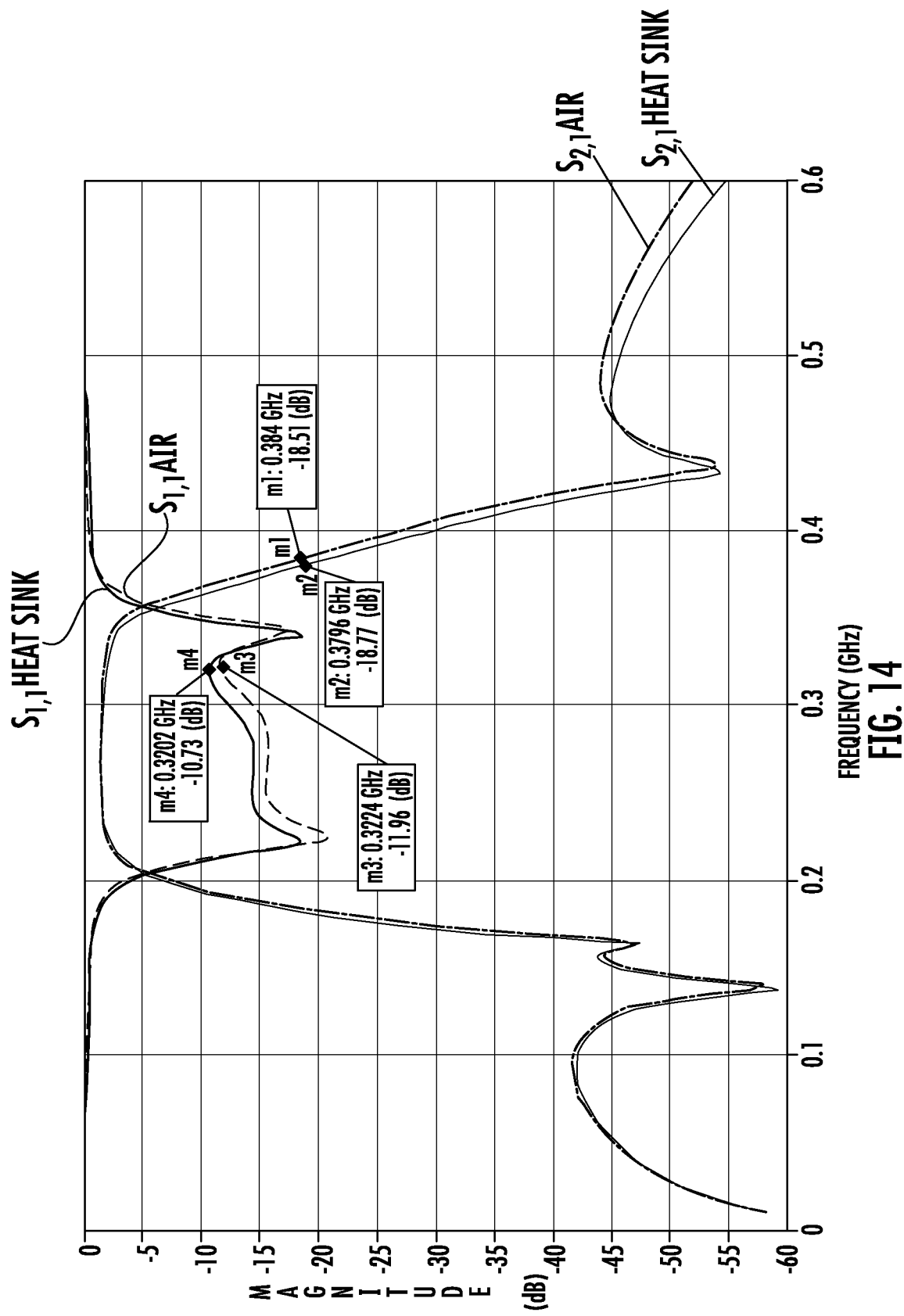

HIGH POWER SURFACE MOUNT FILTER

CROSS REFERENCE TO RELATED APPLICATION

The present application is a continuation of U.S. application Ser. No. 16/572,740 having a filing date of Sep. 17, 2019, which claims filing benefit of U.S. Provisional Patent Application Ser. No. 62/732,605 having a filing date of September 18, 2018, which are incorporated herein by reference in their entirety.

BACKGROUND OF THE DISCLOSURE

Electric filters perform many functions and are employed in a variety of electrical devices. A trend towards miniaturization has increased the demand for smaller passive components. Miniaturization of passive components, however, generally undesirably reduces power handling capacity. A compact filter assembly that is capable of operating at elevated power levels would be welcomed in the art.

SUMMARY OF THE DISCLOSURE

In accordance with one embodiment of the present disclosure, a filter assembly may include a monolithic filter having a surface and a heat sink coupled to the surface of the monolithic filter. The heat sink may include a layer of thermally conductive material that has a thickness that is greater than about 0.02 mm.

In accordance with another embodiment of the present disclosure, a multi-layer organic filter assembly may include a monolithic filter having a surface and a heat sink coupled to the surface of the monolithic filter. The heat sink may include a layer of thermally conductive material.

In accordance with another embodiment of the present disclosure, a filter assembly may include a monolithic filter having a surface and a heat sink coupled to the surface of the monolithic filter. The heat sink may include a layer of thermally conductive material. The filter assembly may exhibit a first insertion loss at about 25° C. and at a first frequency. The filter assembly may exhibit a second insertion loss at a second temperature and at about the first frequency. A temperature difference between the first temperature and the second temperature may be about 30° C. or greater. A difference between the second insertion loss and the first insertion loss may be about 5 dB or less.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 3A through 3D are various views of a single stitched metal layer building block for a high-performing inductor which may be included in a filter according to aspects of the present disclosure;

FIGS. 4A and 4B are top down and side elevation views, respectively, of a simplified filter assembly including a heat sink according to aspects of the present disclosure;

FIGS. 5A and 5B are top down and side elevation views, respectively, of a simplified filter assembly including a heat sink that includes fins according to aspects of the present disclosure;

FIG. 7A is a temperature distribution generated in a thermal simulation analysis of the filter assembly of FIGS. 4A and 4B, in which the heat sink includes a layer of alumina, and the filter assembly is subjected to a signal having a power of 1 W according to aspects of the present disclosure;

FIG. 7B is a temperature distribution generated in a thermal simulation analysis of the filter assembly of FIGS. 4A and 4B, in which the heat sink includes a layer of aluminum nitride, and the filter assembly is subjected to a signal having a power of 1 W according to aspects of the present disclosure;

FIG. 9A is a temperature distribution generated in a thermal simulation analysis of the filter assembly of FIGS. 4A and 4B, in which the heat sink includes a layer of alumina, being subjected to a signal having a power of 5 W;

FIG. 9B is a temperature distribution generated in a thermal simulation analysis of the filter assembly of FIGS. 4A and 4B, in which the heat sink includes a layer of aluminum nitride, being subjected to a signal having a power of 5 W according to aspects of the present disclosure;

FIG. 14 is a plot of experimentally determined insertion loss ($S_{2,1}$) and return loss ($S_{1,1}$) characteristics of a filter assembly both with and without a heat sink;

Figure 1:
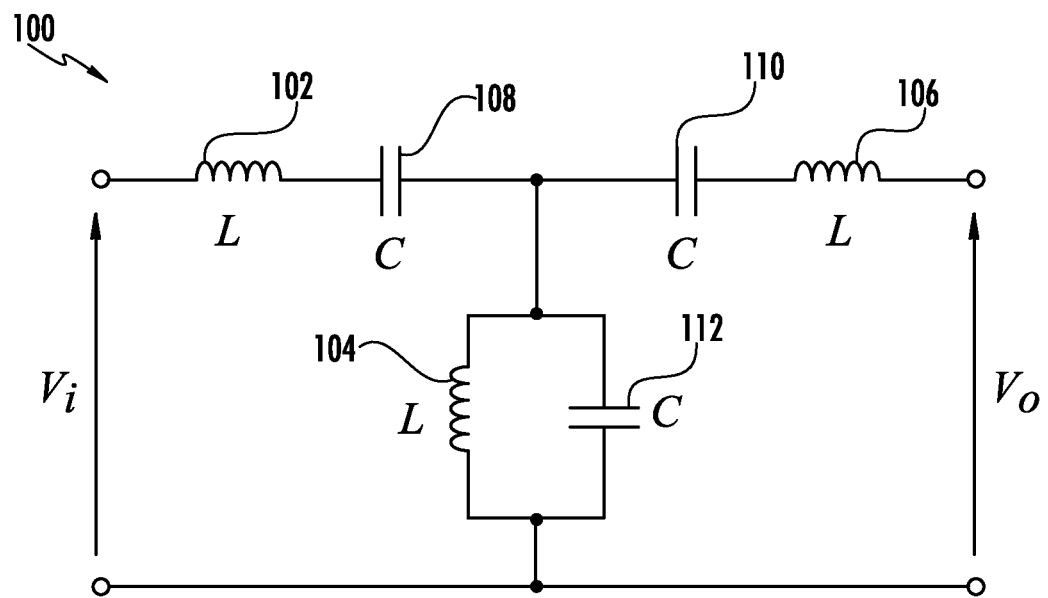
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a filter assembly having excellent heat dissipating capabilities. The filter assembly can include a monolithic filter having a generally planar surface and a heat sink coupled to the generally planar surface of the monolithic filter. The heat sink can include a layer of thermally conductive material that has a thickness greater than about 0.02 mm.

The layer of thermally conductive material facilitates heat flow away from the monolithic filter, which allows the monolithic filter to operate at higher power levels without overheating. Current flowing through the monolithic filter generates heat that can undesirably overheat the filter assembly. By improving heat dissipation away from the filter assembly, the filter assembly may have a larger power capacity. In other words, the filter assembly may be able to dissipate energy at a greater rate without overheating such that the filter assembly may safely operate at a high power level.

The layer of thermally conductive material may also provide electrical shielding. As a result, the filter assembly may be less sensitive to interference, for example, from nearby objects. The filter assembly may be better suited for installation in compact spaces.

The monolithic filter may include one or more organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation., and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other theremoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

The dielectric constant of the organic dielectric material may be between approximately 1.5 and 100, in some embodiments from about 2 to about 15, and in some embodiments from about 2 to about 4. The tangent may range from about 0.001 to about 0.02, in some embodiments from about 0.002 to about 0.004.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other theremoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetraflouroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semiconductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In one example, the dielectric material may have a dielectric constant within a range from between about 2000 and about 4000.

Regardless of the particular configuration employed, the present inventors have discovered that through selective control over the arrangement and materials of a filter assembly including a heat sink coupled to a monolithic filter, a compact filter assembly can be achieved that provides improved heat dissipation and power handling capabilities in combination with excellent performance characteristics and improved electric shielding. In some embodiments, the filter assembly also exhibits consistent performance characteristics across a wide range of temperatures.

The excellent performance characteristics of the filter assembly may include low insertion loss for frequencies within a pass band frequency range of the filter assembly. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the filter assembly exhibits excellent rejection of frequencies outside the pass band frequency range. The insertion loss for frequencies outside the pass band frequency range may be less than about −15 dB, in some embodiments less than about −25 dB, in some embodiments less than about −35 dB, and in some embodiments less than about −40 dB.

Additionally, the filter assembly may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, and in some embodiments greater than about 0.3 dB/MHz, in some embodiments greater than about 0.4 dB/MHz.

The filter assembly may also exhibit consistent performance characteristics (e.g., insertion loss, return loss, etc.) across a wide range of temperatures. In some embodiments, the insertion loss of the filter assembly may vary less than 5 dB or less across large temperature ranges. For example, the filter assembly can exhibit a first insertion loss at about 25° C. and at a first frequency. The filter assembly can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB, in some embodiments about 0.5 dB or less, and in some embodiments, about 0.2 dB or less. The first frequency may fall within a passband frequency range of the filter or within a rejection frequency band of the filter. The first frequency may range from about 100 MHz to about 9,000 MHz, in some embodiments from about 200 MHz to about 8,000 MHz.

The filter assembly can also operate at elevated power levels without overheating and being damaged. In some embodiments, the filter assembly may have a power capacity of greater than about 1 W at about 300 MHz, in some embodiments greater than about 2 W, in some embodiments, greater than about 3 W, in some embodiments, greater than about 4 W, in some embodiments, greater than about 5 W, and in some embodiments, greater than about 10 W. The power capacity may be defined as the power level (root-mean-square) transmitted through the filter assembly at steady state conditions that causes the filter assembly to reach a maximum acceptable operating temperature (e.g., 85° C.) when mounted to a surface that is maintained at 25° C.

"Area power capacity" (W/mm$^2$) may be defined as power capacity (W) divided by the area or footprint of the component. The "area" or "footprint" of the component refers to the cross-sectional area of the component (e.g., the area of a mounting surface, such as a printed circuit board, that is occupied by the filter assembly once mounted). Area power capacity may be a suitable metric for quantifying a combination of improved power handling and compact size.

For example, the filter assembly may have an area power capacity of greater than about 0.03 W/mm$^2$ at about 300 MHz, in some embodiments greater than about 0.10 W/mm$^2$, in some embodiments greater than about 0.2 W/mm$^2$, in some embodiments greater than about 0.5 W/mm$^2$, in some embodiments greater than about 1 W/mm$^2$, in some embodiments greater than about 2 W/mm$^2$, and in some embodiments greater than 4 W/mm$^2$.

In some embodiments, the filter assembly may have a compact size, e.g., footprint. For example, in some embodiments, the filter assembly may have an overall length from about 0.5 mm to about 30 mm, in some embodiments, from about 1 mm to about 15 mm, and in some embodiments from about 1.25 mm to about 5 mm.

In some embodiments, the filter assembly may have an overall width from about 0.2 mm to about 20 mm, in some embodiments from about 0.5 mm to about 15 mm, in some embodiments from about 1 mm to about 10 mm, and in some embodiments from about 3 mm to about 7 mm.

In some embodiments, the filter assembly may have an overall thickness from about 0.25 mm to about 4 mm, in some embodiments from about 0.5 mm to about 3 mm, and in some embodiments from about 0.75 mm to about 2 mm.

The heat sink may include a layer of thermally conductive material. The thickness of the layer of thermally conductive material may range from about 0.02 mm to about 2.5 mm, in some embodiments from about 0.13 mm to about 1.25 mm, in some embodiments from about 0.25 mm to about 0.75 mm, e.g., about 0.4 mm.

The layer of thermally conductive material may have a high thermal conductivity. For example, in some embodiments, the thermally conductive material may comprise a material having a thermal conductivity at about 22° C. that ranges from about 100 W/m·° C. to about 300 W/m·° C., in other embodiments from about 125 W/m·° C. to about 250 W/m·° C., in other embodiments from about 150 W/m·° C. to about 200 W/m·° C.

The thermally conductive material may be formed from a variety of suitable materials. For example, in some embodiments, the thermally conductive material may comprise aluminum nitride, alumina, or any suitable composition including aluminum nitride or alumina. The thermally conductive material may contain additives or impurities. Additional suitable materials for the thermally conductive material include beryllium oxide, aluminum oxide, boron nitride, silicon nitride, magnesium oxide, zinc oxide, silicon carbide, any suitable ceramic material, and mixtures thereof.

The layer of thermally conductive material may also provide electrical shielding for the monolithic filter, increasing the robustness of the filter assembly. Additionally, in some embodiments, the thickness of the thermally conductive material may be selected to tune one or more performance characteristics of the filter assembly.

I. Filter

FIG. 1 illustrates a simplified schematic of a band pass filter 100 according to aspects of the present disclosure. The filter may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
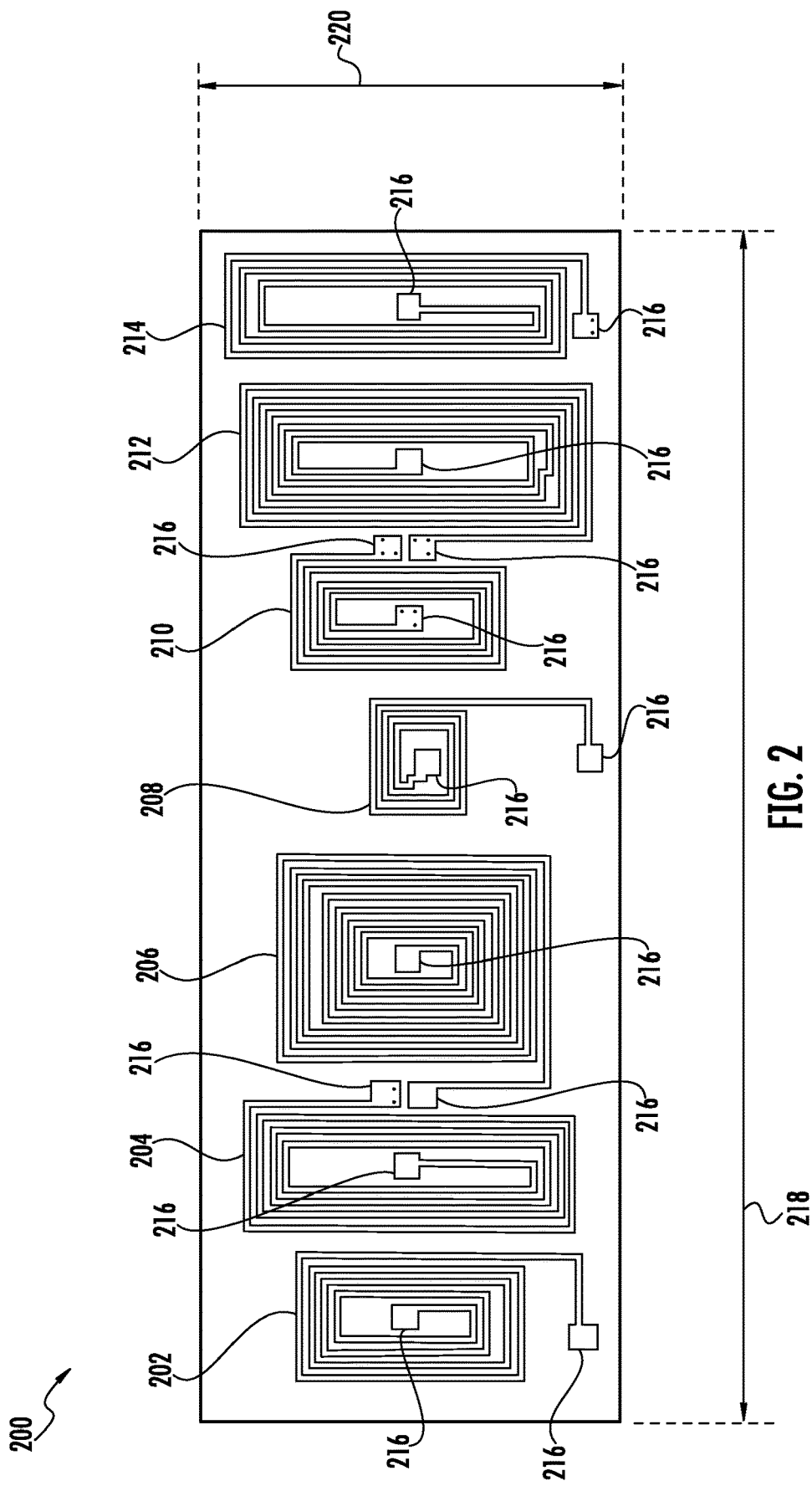
FIG. 2 is a top-down view of a band pass filter according to aspects of the present disclosure.

FIG. 2 is a top-down view of a band pass filter 200 according to aspects of the present disclosure. The band pass filter 200 may include a plurality of inductors 202, 204, 206, 208, 210, 212, 214. The band pass filter 200 may include various connection points or contact pads that may be used to electrically connect the various inductors 202, 204, 206, 208, 210, 212, 214 to form a filter circuit.

In some embodiments, the filter 100 may be formed incorporating organic dielectric materials and/or incorporate multiple layers of such materials. In accordance with an embodiment of the present disclosure, inductors described above with respect to the bandpass filter 100 may be formed using high-performing multi-layer inductors as described herein. In particular, these high-performing multi-layer inductors may provide for high-Q factors and high current-carrying capabilities.

FIG. 3A illustrates a functional block diagram of a stitched metal layer building block 800a that may be utilized in high-performing inductors according to aspects of the present disclosure. FIG. 3B illustrates a three-dimensional view of the building block 800a of FIG. 3A. In particular, as shown in FIG. 3B, the building block 800a may be comprised of a first inductor section 850 and a second inductor section 852. The first inductor section 850 may include a first connection point 854 and a second connection point 856. Likewise, the second inductor section 852 may include a first connection point 858 and a second connection point 860. While the first inductor section 850 and the second inductor section 852 in FIG. 3C each form the shape of a spiral, inductor sections 850, 852 may be a loop, circular, hexagonal, and other polygonal shapes with a variety of complete or partial turns without departing from embodiments of the present disclosure. In addition, the first inductor section 850 and the second inductor section 852 may be substantially identical in shape and vertically aligned in some embodiments.

As shown in FIG. 3B, the first inductor layer section 850 and the second inductor section 852 may be stitched together to form a single stitched metal layer building block 800a. More specifically, according to an exemplary embodiment of the present disclosure, the first connection point 854 of the first inductor section 850 may be connected or stitched to the first connection point 858 of the second inductor section 852 using a plated via 814. The first connection point 854 can also serve as an input for the building block 800a. Similarly, the second connection point 856 of the first inductor section 850 may be connected or stitched to the second connection point 860 of the second inductor section 852 using a plated via 815. In addition, the plated via 815 may further be connected to a routing layer 862. The routing layer 862 may in turn be connected to an output 864 using a plated via 816. Plated vias 814, 815, and 816, which may be microvias, may be created by drilling (e.g., mechanical drilling, laser drilling, etc.) through holes (perhaps as small in diameter as the thickness of the dielectric used) and plating the through holes with a conductive material, for example using electroless plating or seeded copper. Referring to FIG. 3C, the vias 814, 815, and 816 are illustrated in a top plan view of the stitched metal layer building block 800a.

FIG. 3D illustrates an exemplary stackup 865 that embodies the stitched metal layer building block 800a of FIGS. 14A-14O. In particular, the stackup 865 includes metallization layers 801, 802, and 803, an organic dielectric layer 808, an organic buildup layer 809, and vias 814, 815, 816. The metallization layers 801, 802, and 803, which are formed on the respective organic dielectric layer 808 and organic buildup layer 809, may be conductive layers that are patterned or circuitized as necessary. The metallization layers 801, 802, and 803 may be formed of copper, nickel, gold, silver, and other metals and alloys. According to an aspect of the present disclosure, the organic dielectric layer 808 may be formed of liquid crystalline polymer (LCP), although other materials may be utilized, including PPE, N6000, epoxy based N4000-13, bromine-free material laminated to LCP, organic layers with high K material, unfilled high-K organic layers, Rogers 4350, Rogers 4003 material, and other thermoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material. In addition, the organic dielectric layer 808 may have a dielectric constant of less than approximately 3.1 and a dielectric loss of less than about 0.004. According to an aspect of the present disclosure, the organic dielectric layer 808 may also be thin, perhaps less than around 10 mils, although other thicknesses can be utilized. The organic laminate layer 809 may be formed of an organic buildup material such as laminate LCP, although other materials may be utilized, including prepreg, bond ply, or other thermosetting polymer including epoxy resins, phenolic resins, unsaturated polyester resins, phenolic resins, unsaturated polyester resins, polyimide resins, cyanate resins, polyphenylene ether resins, furmate resins, and polybutadiene resins. The organic laminate layer 809 may have a dielectric constant of less than about 3.5 and a dielectric loss of less than about 0.004. Via 814 may connect metallization layers 801 and 802. Via 815 may connect metallization layers 801, 802, and 803. Via 816 may connect metallization layers 801 and 803.

Still referring to FIG. 3D, the first metallization layer 801 may be patterned or circuitized, as described above, to include the first inductor section 850, which includes the first connection point 854 that may serve as the input for the stitched metal layer building block 800a. Additionally, the first metallization layer 801 can also be patterned or circuitized to include the output 864 for the stitched metal layer building block 800b. Likewise, the second metallization layer 802 can be patterned or circuitized to form the second inductor section 852. Similarly, the third metallization layer 803 can be patterned or circuitized to form the routing layer 862. According to an aspect of the present disclosure, the trace widths and spaces on the above-described metallization layers may be from a few mils or greater.

The stitched metal layer building block 800a comprised of the first and second inductor sections 850 and 852 stitched together may have significant advantages over non-stitched inductor sections. In particular, the stitching of inductor sections 850 and 852 may significantly reduce the DC/RF losses while reduce the inductance value by a substantially lower factor, thereby resulting in an increase in Q-factor. In other words, the parallel connection of the inductor sections 850 and 852 may reduce the resulting resistance at a faster rate than the resulting inductance value.

In addition, the stitched metal layer building block 800a described above with respect to FIGS. 3A-3D can be incorporated with one or more other stitched metal layer building blocks. In addition, one of ordinary skill in the art will recognize that the patterning and circuitization of the metallization layers described above can vary without departing from embodiments of the present disclosure. For example, the trace width and spacing on the metallization layers can vary from a few mils to significantly more mils. In addition, the thickness of the organic dielectric layers and buildup layers can also be varied without departing from embodiments of the present disclosure. For example, the thickness may vary from tens of microns to multiple millimeters.

Figure 3E:
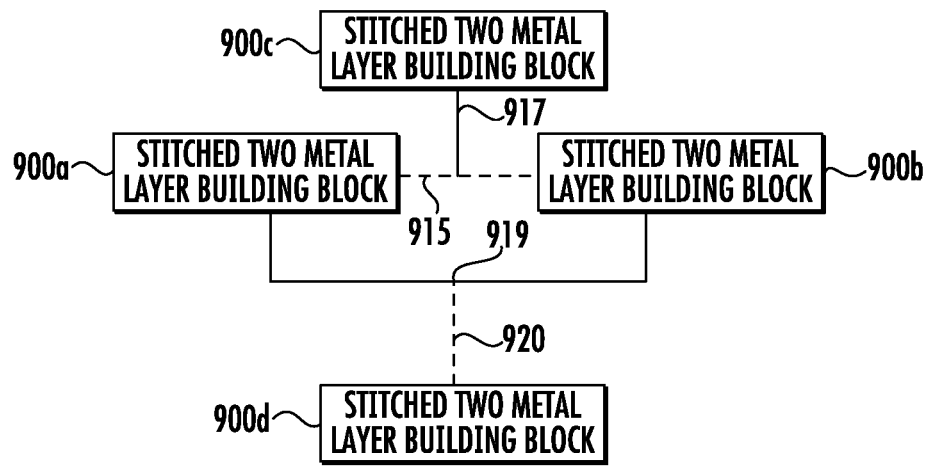
FIGS. 3E and 3F are various views of an example configuration of multiple stitched metal layer building blocks for a high-performing inductor which may be included in a filter according to aspects of the present disclosure.

FIG. 3E is a functional block diagram of an inductor configuration that provides both vertical connections and horizontal connections for stitched metal layer building blocks. For example, FIG. 3E illustrates stitched metal layer building blocks 900a, 900b, 900c, and 900d. As shown in FIG. 3E, a first stitched metal layer building block 900a may be horizontally aligned and connected to a second stitched metal layer building block 900b by plated vias 915. In addition, a third stitched metal layer building block 900c may be vertically connected to the first and second building blocks 900a and 900b by plated via 917. Further, a fourth metal layer building block 900d may be vertically connected to the first and second building blocks 900a and 900b by plated vias 919 and 920.

Figure 3F:
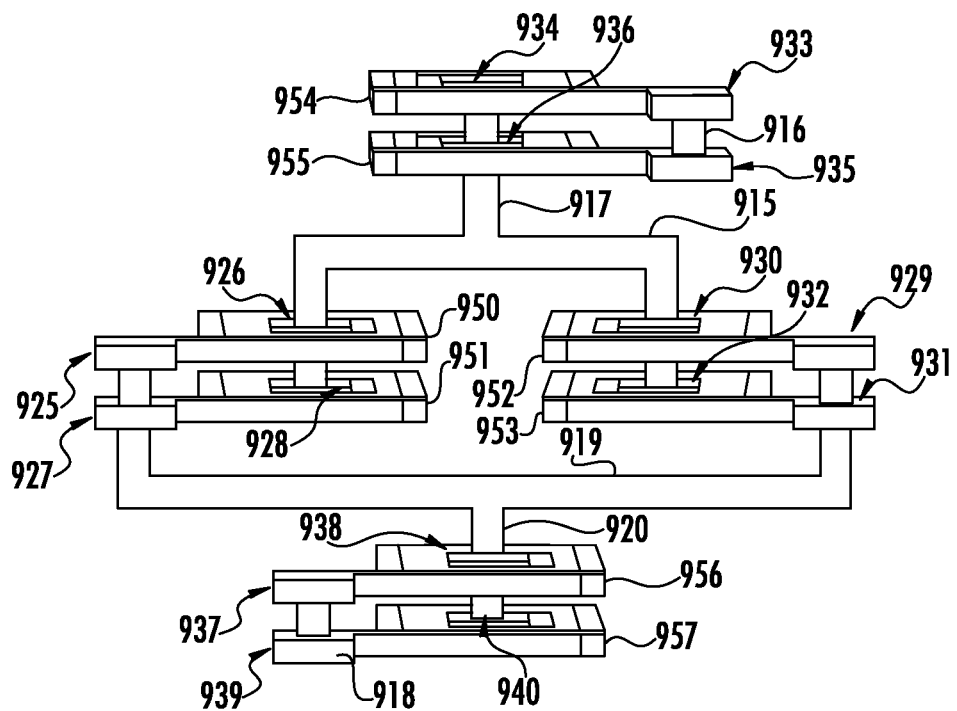

FIG. 3F illustrates a three-dimensional view of the building blocks 900a, 900b, 900c, and 900d in FIG. 3E. As shown in FIG. 3F, the first stitched metal layer building block 900a may include a first inductor section 950 and second inductor section 951. The first and second inductor sections 950, 951 may include respective first connection points 925, 927 and respective connection points 926, 928. In addition, the second stitched metal layer building block 900b may include a first inductor section 952 and a second inductor section 953. The first and second inductor sections 952, 953 may include respective first connection points 929, 931 and respective second connection points 930, 932. Similarly, the third stitched metal layer building block 900c may include a first inductor section 954 and second inductor section 955. The first and second inductor sections 954, 955 may include respective first connection points 933, 935 and second connection points 934, 936. Likewise, the fourth stitched metal layer building block 900d may include a first inductor section 956 and a second inductor section 957. The first and second inductor sections 956, 957 may include respective first connection points 937, 939 and respective second connection points 938, 940.

As described above, the first metal layer building block 900a may be aligned horizontally with the second metal layer building block 900b. Still referring to FIG. 3F, the plated via 915 may connect the second connection points 926, 928 associated with the first metal layer building block 900a with the second connection points 930, 932 associated with the second metal layer building block 900b. In addition, the plated via 919 may connect the first connection points 925, 927 associated with the first metal layer building block 900a with the first connection points 929, 931 associated with the second metal layer building block 900b.

Figure 18A:
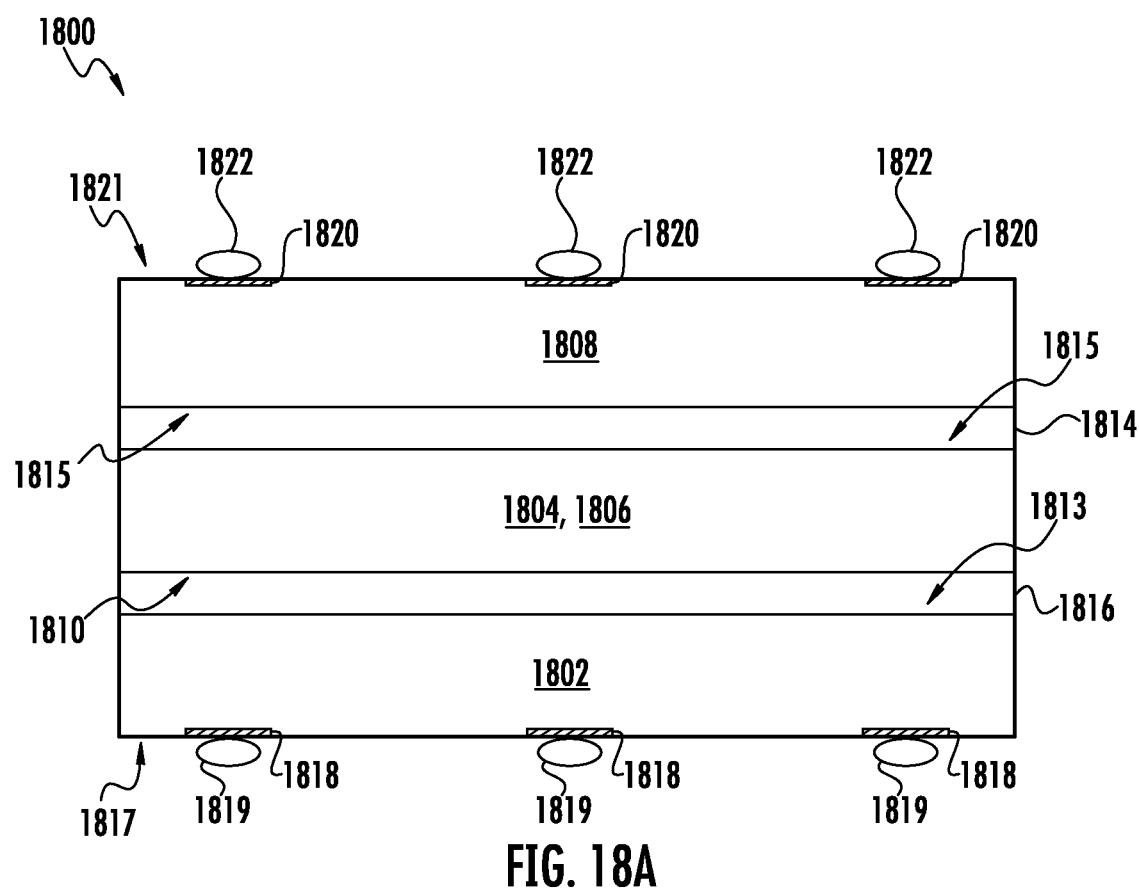
FIG. 18A is a simplified side elevation view of another embodiment of the filter assembly that includes a first monolithic filter and a second, additional monolithic filter arranged in a stacked configuration with a heat sink.
Figure 18B:
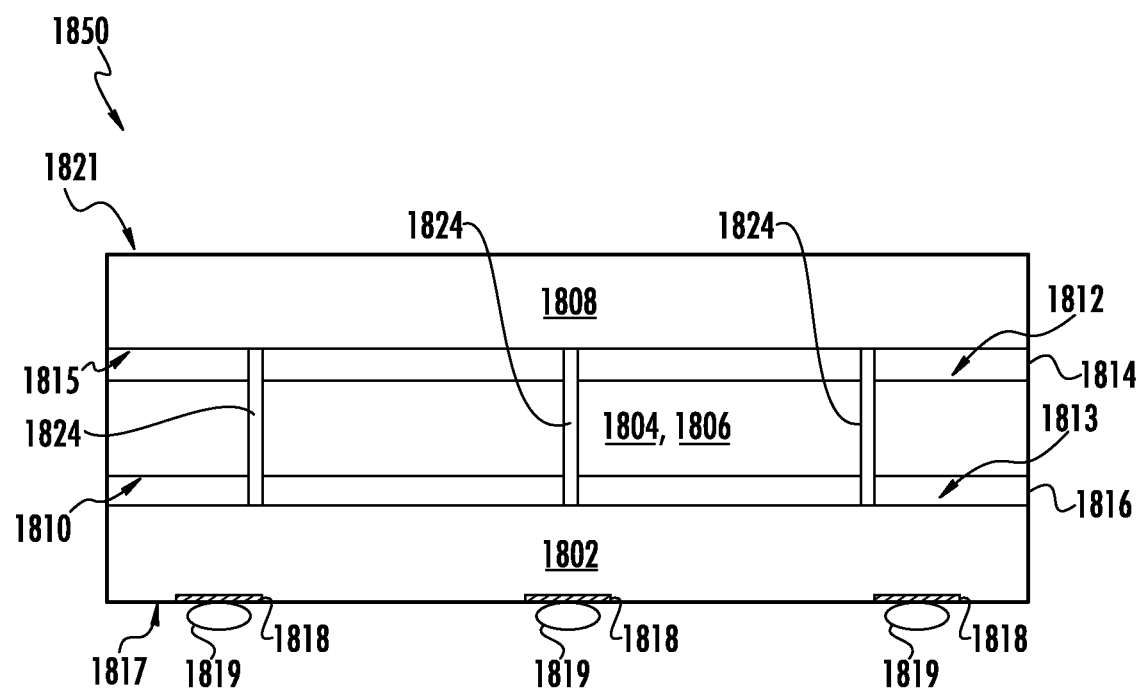
FIGS. 18B and 18C are simplified side elevation views of additional embodiments of the filter assembly that include a first monolithic filter, a second monolithic filter, and at least one via extending through a heat sink between the first and second monolithic filters.

As also described above, one or more of the third and fourth metal layer building blocks 900c and 900d may be connected to the first and second metal layer building blocks 900a and 900b. Referring to FIG. 18B, a plated via 917 may connect the second connection points 934, 936 associated with the third metal layer building block 900c to the plated via 915, thereby providing a vertical connection between the third metal layer building block 900c and the first and second metal layer building blocks 900a and 900b. A plated via 916 may connect the first connection points 933 and 935 associated with the third metal layer building block 900c. In addition, a plated via 920 may connect the second connection points 938, 940 associated with the fourth metal layer building block 900d to the plated via 919, thereby providing a vertical connection between the fourth metal layer building block 900d and the first and second metal layer building blocks 900a and 900b. Further, a plated via 918 may connect the first connection points 937 and 939 associated with the fourth metal layer building blocks 900d.

II. Heat Sink

FIGS. 4A and 4B are top down and side elevation views, respectively, of a simplified filter assembly 400 according to aspects of the present disclosure. The filter assembly 400 may include a monolithic filter 402 that has a generally planar surface 404. Details of the monolithic filter 402 are omitted from FIGS. 4A and 4B. However, it should be understood that, in some embodiments, the filter 402 may be or include a bandpass filter that includes organic dielectric materials as explained above with reference to FIGS. 1 through 3F. However, in other embodiments, the filter 402 may be or include any suitable type of filter, including for example a high pass filter or a low pass filter. Additionally, in some embodiments, the filter 402 may include ceramic dielectric materials instead of organic dielectric materials. The filter 402 may be any suitable electric filter configured to performing filtering functions with respect to an electrical signal.

The filter assembly 400 may include a heat sink 406 coupled to the generally planar surface 404 of the monolithic filter 402. The heat sink 406 may include a layer 407 of thermally conductive material. A layer of adhesive (e.g., an epoxy) may be used to adhere the heat sink 406 to the generally planar surface 404 of the monolithic filter 402.

The filter assembly 400 may be configured to be surface mounted, for example, on a printed circuit board. Referring to FIG. 4B, the filter assembly 400 may have various connection points (e.g., corresponding to one or more of the connection points 216 of the filter 200 described above with reference to FIG. 2.) The connection points 408 may be coupled via solder 409 with a mounting surface 410, such as a printed circuit board.

The filter assembly 400 may have a length 412 in an X-direction 414 and a width 416 in a Y-direction 418. The filter assembly 400 may also have a thickness 420 in a Z-direction 422. Additionally, the filter 402 may have a filter thickness 425 in the Z-direction 422, and the layer of thermally conductive material of the heat sink 406 may have a layer thickness 424 in the Z-direction 422. The thickness 420 of the filter assembly 400 may be the sum of the filter thickness 425 and the layer thickness 424.

FIGS. 5A and 5B are top down and side elevation views, respectively, of a simplified filter assembly 500 according to aspects of the present disclosure. The filter assembly 500 may be generally configured similarly to the filter assembly 400 described above with reference to FIGS. 4A and 4B. Additionally, the heat sink 506 of the filter assembly 500 may include a plurality of fins 511 configured to improve heat dissipation away from the filter assembly 500 (e.g., through convection into ambient air). The fins 511 may have a variety of suitable shapes. For example, the fins may have generally uniform triangular cross sectional shapes that are extruded across the width 516 of the filter assembly 50 in the X-direction 518, as illustrated in FIGS. 5A and 5B. It should be understood that the fins 511 may have any suitable configuration, however. For example, the fins 511 may have cross sectional shapes that are extruded across the length 514 of the filter assembly 500 in the Y-direction 514 and/or generally uniform cross sectional shapes that are extruded upward in the Z-direction 522 (e.g., forming vertical columns). The fins 511 may also have a variety of other cross sectional shapes, including for example, rectangular or any other suitable shape (e.g., pentagonal, hexagonal, etc.). In some embodiments, the fins 511 may be tapered, such as conically shaped.

The filter assembly 500 may have a length 512 in an X-direction 514 and a width 516 in a Y-direction 518. The filter assembly 500 may also have a thickness 520 in a Z-direction 522. Additionally, the filter 502 may have a filter thickness 522 in the Z-direction 522; the layer 507 of the thermally conductive material may have a layer thickness 524 in the Z-direction 522; and the fins 511 may extend a fin height 526 beyond the layer 507 in the Z-direction 522. The thickness 520 of the filter assembly 500 may be the sum of the filter thickness 522, the layer thickness 524, and the fin height 526.

III. Thermal Simulation and Testing

Thermal simulation analysis was performed of the filter assembly both without a heat sink and with a heat sink (as described above with reference to FIGS. 4A and 4B). Additionally, analysis was performed comparing the performance of a heat sink including a layer of alumina with a heat sink including a layer of aluminum nitride. The analysis was performed at two different power levels: 1 W and 5 W. More specifically, thermal analyses of the filter assembly were performed for sinusoidal input signals having a frequency of about 300 MHz with root-mean-square powers of 1 W and 5 W. The following table presents simulation results for filter assemblies without heat sinks as well as simulation results for filter assemblies including heat sinks that include a layer of aluminum nitride or alumina:

TABLE 1

| | Simulation Results | |
|---|---|---|
| Heat Sink Material | Max. Temp. (° C.) at 1 W | Max. Temp. (° C.) at 5 W |
| None/Air | 40.0 | 100.1 |
| Alumina | 30.2 | 51.2 |
| Aluminum Nitride | 28.8 | 44.2 |

Figure 6:
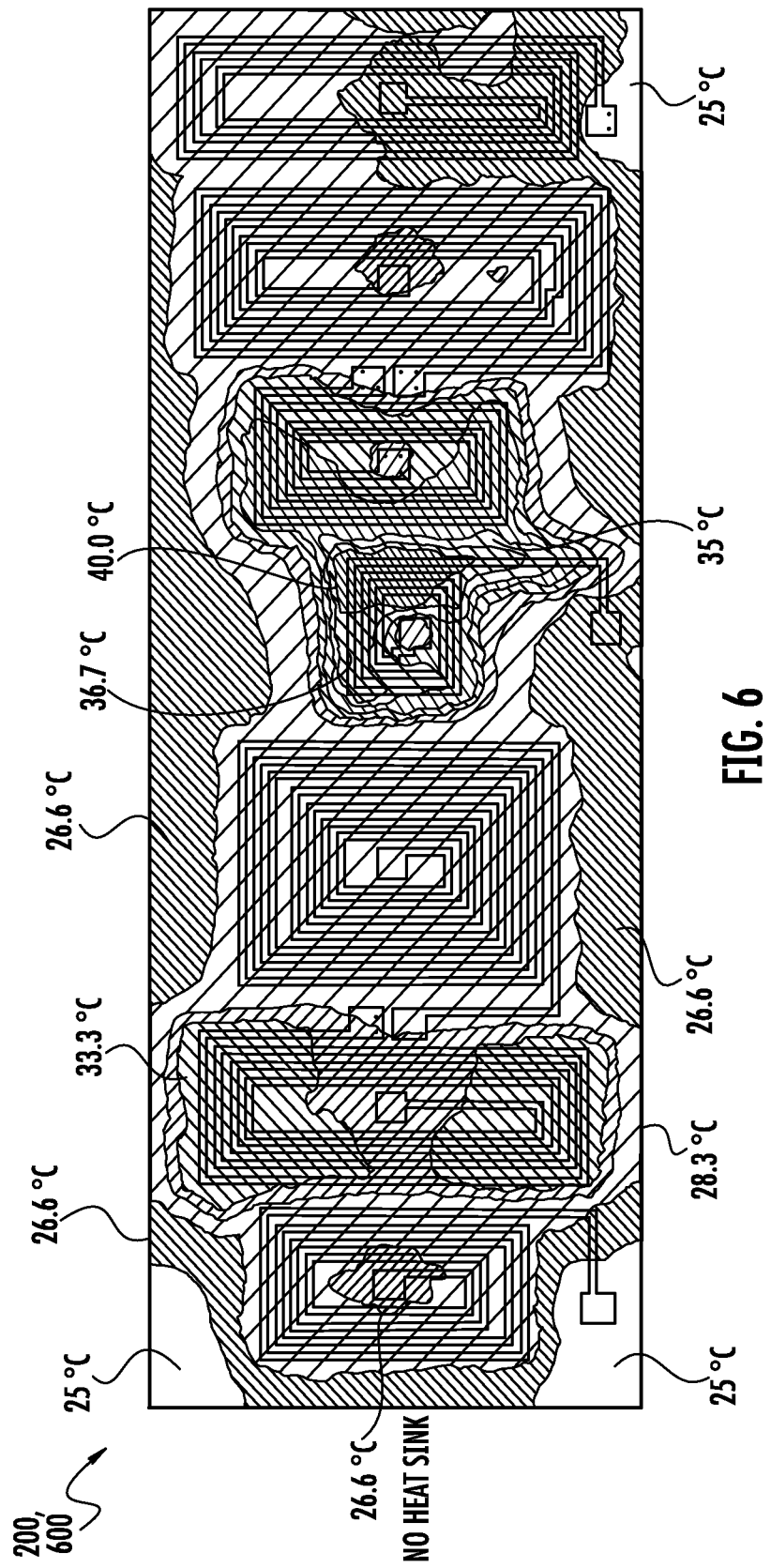
FIG. 6 is a temperature distribution generated in a thermal simulation analysis of a filter assembly that does not include a heat sink, when subjected to a signal having a power of 1 W.

FIG. 6 illustrates a temperature distribution 600 generated in a thermal simulation analysis of a filter assembly that does not include a heat sink. In the simulation, a sinusoidal input signal having a frequency of about 300 MHz with a root-mean-square power of 1 W was applied to the filter 200. The resulting temperature distribution includes a maximum temperature of about 100° C. The simulation was performed with the assumption that the surface to which the filter assembly is mounted is maintained at 25° C.

FIG. 7A illustrates a temperature distribution 700 of the filter assembly 400 of FIGS. 4A and 4B, which includes a heat sink 406 including a layer 407 of alumina. In this simulation analysis, the layer thickness 424 (illustrated in FIGS. 4A and 4B) of the layer 407 of thermally conductive material was 0.508 mm, and a sinusoidal input signal having a frequency of about 300 MHz with a root-mean-square power of 1 W was applied to the filter 400. The simulation was performed with the assumption that the surface to which the filter assembly is mounted is maintained at 25° C. The resulting temperature distribution 700 had a maximum temperature of 30.2° C. Thus, the thermal analysis indicates that the layer 407 of alumina of the heat sink 406 reduces the maximum temperature under the same simulation conditions from 40° C. (as discussed with reference to FIG. 6) to 30.2 C.

FIG. 7B illustrates a temperature distribution 750 of the filter assembly 400 of FIGS. 4A and 4B, which includes a heat sink 406 including a layer 407 of aluminum nitride. In this simulation analysis, the layer thickness 424 of the layer 407 of thermally conductive material was 0.508 mm, and a sinusoidal input signal having a frequency of about 300 MHz with a root-mean-square power of 1 W was applied to the filter 400. The simulation was performed with the assumption that the surface to which the filter assembly is mounted is maintained at 25° C. The resulting temperature distribution 700 had a maximum temperature of 28.8° C. Thus, the thermal analysis indicates that the layer 407 of aluminum nitride of the heat sink 406 reduces the maximum temperature under the same simulation conditions from 40° C. (as discussed with reference to FIG. 6) to 28.8° C.

Figure 8:
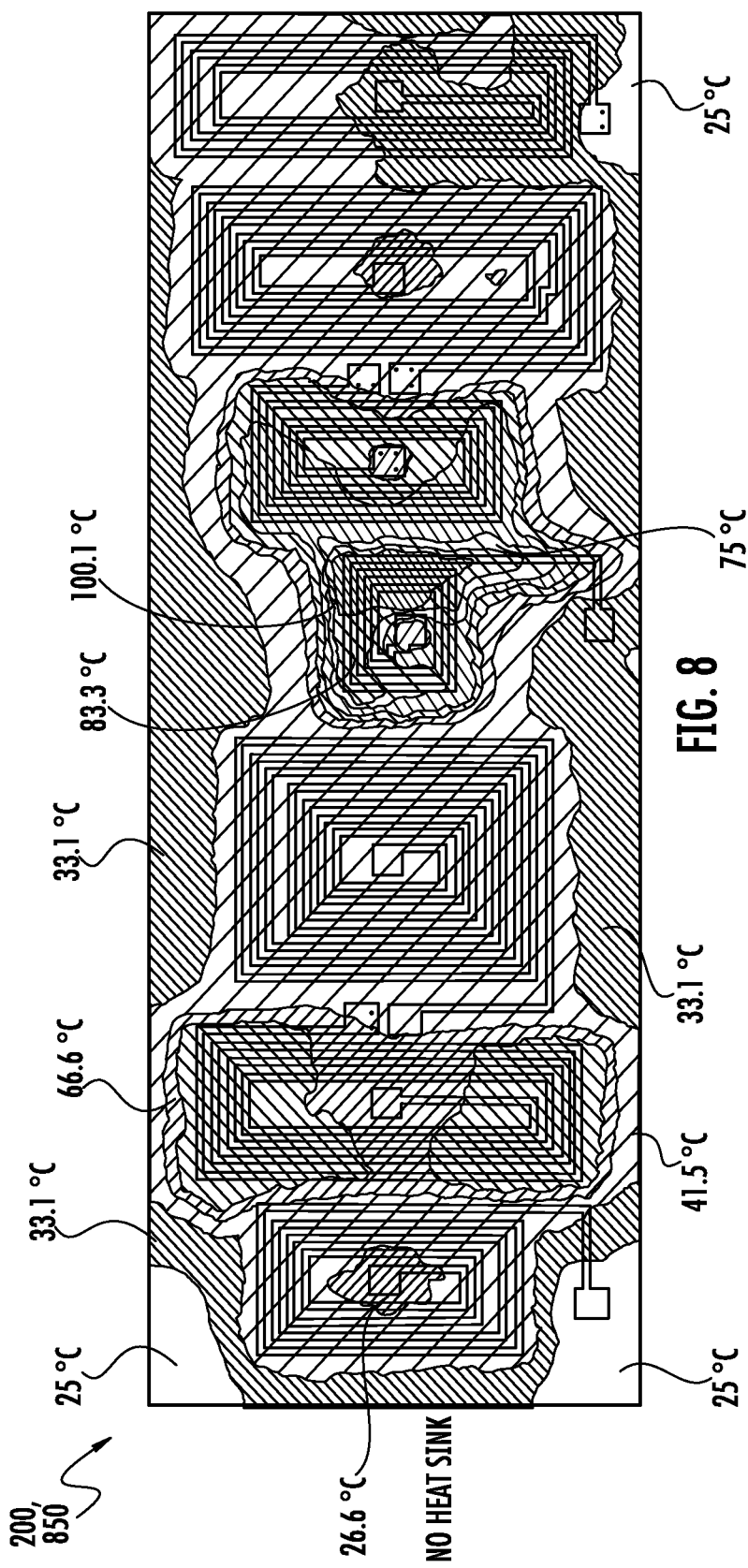
FIG. 8 is a temperature distribution generated in a thermal simulation analysis of a filter assembly that does not include a heat sink, when subjected to a signal having a power of 5 W.

FIG. 8 illustrates a temperature distribution 850 generated in a thermal simulation analysis of a filter assembly that does not include a heat sink. In the simulation, a sinusoidal input signal having a frequency of about 300 MHz with a root-mean-square power of 5 W was applied to the filter 200. The resulting temperature distribution includes a maximum temperature of 100.1° C. The simulation was performed with the assumption that the surface to which the filter assembly is mounted is maintained at 25° C.

FIG. 9A illustrates a temperature distribution 960 of the filter assembly 400 of FIGS. 4A and 4B. In this simulation, the filter assembly 400 includes a heat sink 406 including a layer 407 of alumina (illustrated in FIGS. 4A and 4B). In this simulation, the layer thickness 424 (shown in FIG. 4B) of the layer 407 of thermally conductive material was 0.508 mm, and a sinusoidal input signal having a frequency of about 300 MHz with a root-mean-square power of 5 W was applied to the filter 400. The simulation was performed with the assumption that the surface to which the filter assembly is mounted is maintained at 25° C. Referring to FIG. 9A, the resulting temperature distribution 700 had a maximum temperature of 51.2° C. Thus, the thermal analysis indicates that the layer 407 of alumina of the heat sink 406 reduces the maximum temperature under the same simulation conditions from 100.1° C. (as discussed with reference to FIG. 8) to 51.2° C.

FIG. 9B illustrates a temperature distribution 980 of the filter assembly 400 of FIGS. 4A and 4B, which includes a heat sink 406 including a layer 407 of aluminum nitride. In this simulation analysis, the layer thickness 424 of the layer 407 of thermally conductive material was 0.508 mm, and a sinusoidal input signal was applied to the filter 400 having a frequency of about 300 MHz with a root-mean-square power of 1 W. The simulation was performed with the assumption that the surface to which the filter assembly is mounted is maintained at 25° C. The resulting temperature distribution 700 had a maximum temperature of 44.2° C. Thus, the thermal analysis indicates that the layer 407 of aluminum nitride of the heat sink 406 reduces the maximum temperature under the same simulation conditions from 100.1° C. (as discussed with reference to FIG. 8) to 44.2° C.

IV. Power Capacity

Filter assemblies according to aspects of the present disclosure were assembled and tested. Each filter assembly was subjected to a steady state power level until the filter assembly reached a steady state temperature. The power level was then increased and the process was repeated until the steady state temperature was greater than about 85° C. or the power level reached 6 W.

The following table present performance characteristic and dimensional data for an example high frequency band pass filter assembly that was tested.

TABLE 2

Example High Frequency Band Pass Filter Electrical Properties

| Parameter | Min | Typical | Max | Unit |
|---|---|---|---|---|
| Pass band | | | | |
| 2200 MHz | −2.0 | −1.3 | | dB |
| 1900-2500 MHz | −2.0 | −1.6 | | dB |
| Rejection | | | | |
| 400-7000 MHz | | −41 | −35 | dB |
| 7000-9000 MHz | | −50 | −40 | dB |
| Return Loss | | | | |
| 2200 MHz | | −13 | | dB |
| Power | | | | |
| 2200 MHz | | | 2 | W |
| Dimensions | | | | |
| Length | 7.66 | 7.79 | 7.92 | mm |
| Width | 3.85 | 3.98 | 4.11 | mm |
| Filter Thickness Without Heat Sink | | | 0.6 | mm |
| Filter Thickness With Heat Sink | | | 1.11 | mm |

Figure 10:
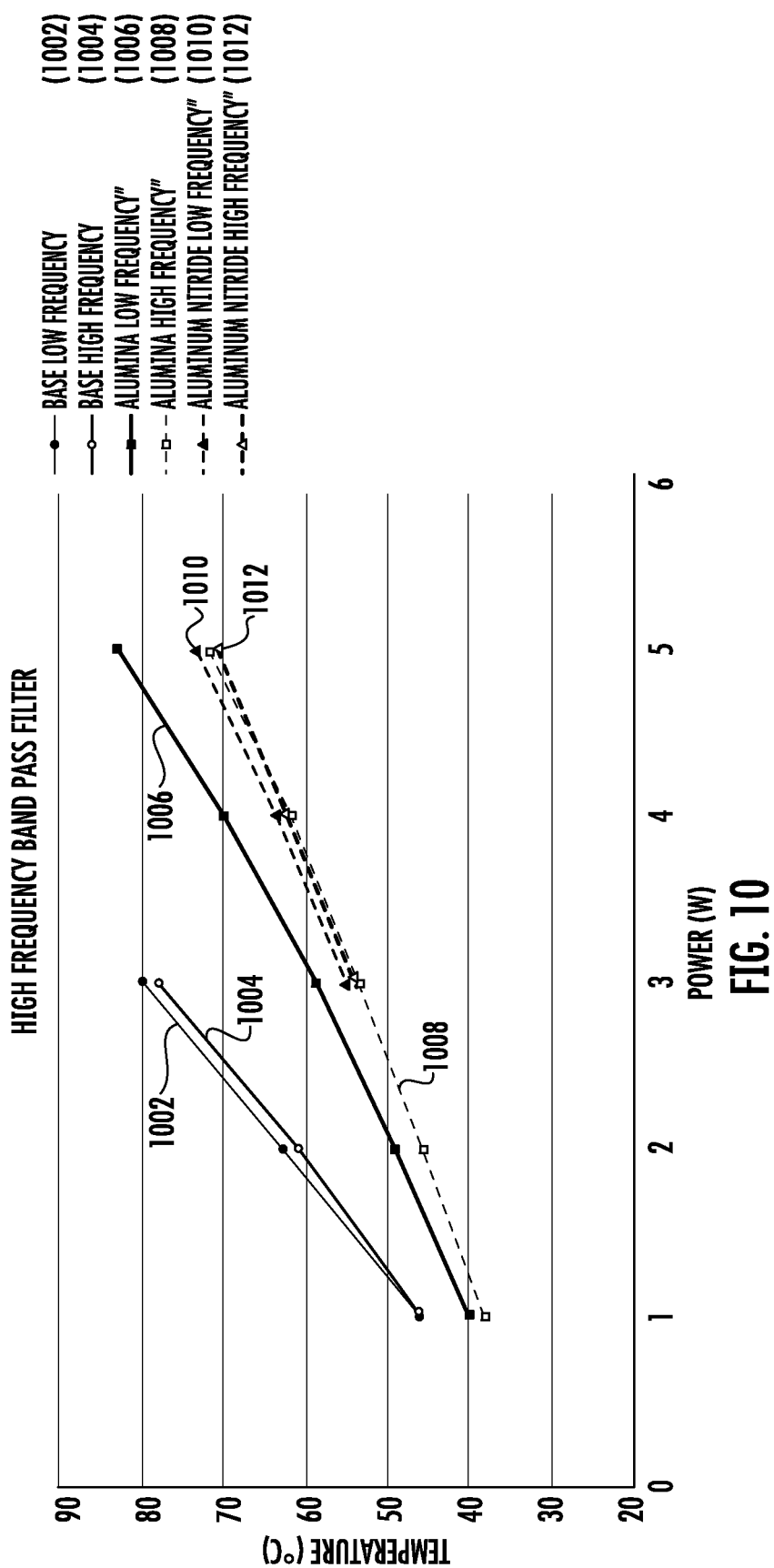
FIGS. 10 through 12 are plots of empirically obtained power and temperature data for various filter assemblies according to aspects of the present disclosure.

Referring to FIG. 10, the effect of adding a heat sink layer to the high frequency filter assembly of Table 2 was tested. The filter assembly was tested without a heat sink, with a heat sink including a layer of alumina, and with a heat sink including a layer of aluminum nitride. In each case, the layer of thermally conductive material was 0.51 mm thick. The filter assemblies were subjected to various sinusoidal signals having respective root-mean-square power levels as indicated on the horizontal axis until the filter assembly reached a steady state temperature for each power level. The steady state temperature (represented on the vertical axis) was measured at each power level. As used in FIGS. 10, 11, and 12, "High" frequency refers to a frequency of 2,200 MHz, and "Low" frequency refers to a frequency of 110 MHz. "Base" refers to a filter assembly that does not include a heat sink.

The following table present performance characteristic and dimensional data for an example low frequency band pass filter assembly that were tested.

TABLE 3

Example Low Frequency Band Pass Filter Electrical Properties

| Parameter | Min | Typical | Max | Unit |
|---|---|---|---|---|
| Pass band | | | | |
| 110 MHz | −2.0 | −1.6 | | dB |
| 95-120 MHz | −2.5 | −2.1 | | dB |
| Rejection | | | | |
| 200-500 MHz | −60 | −43 | −35 | dB |
| Return Loss | | | | |
| 95-120 MHz | | −12 | | dB |
| Power | | | | |
| 95-120 MHz | | | 5 | W |
| Dimensions | | | | |
| Length | 15.11 | 15.24 | 15.37 | mm |
| Width | 6.22 | 6.35 | 6.48 | mm |
| Filter Thickness Without Heat Sink | | | 1.0 | mm |
| Filter Thickness With Heat Sink | | | 1.51 | mm |

Figure 11:
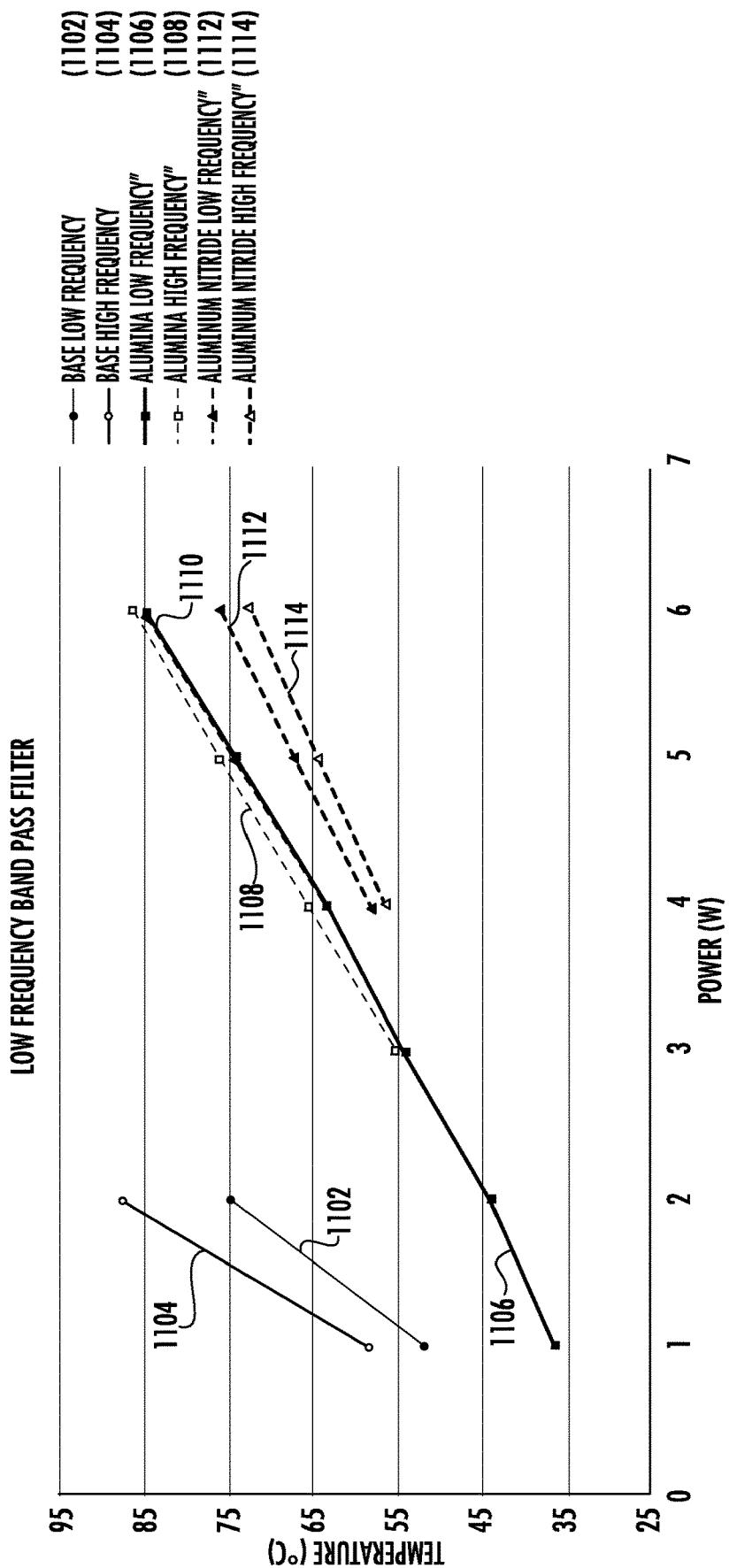

Referring to FIG. 11, the effect of adding a heat sink layer to the low frequency filter assembly of Table 3 was tested. The filter assembly was tested without a heat sink, with a heat sink including a layer of alumina, and with a heat sink including a layer of aluminum nitride. In each case, the layer of thermally conductive material was 0.51 mm thick. The filter assemblies were subjected to various sinusoidal signals having respective root-mean-square power levels as indicated on the horizontal axis until the filter assembly reached a steady state temperature for each power level. The steady state temperature (represented on the vertical axis) was measured at each power level.

Figure 12:
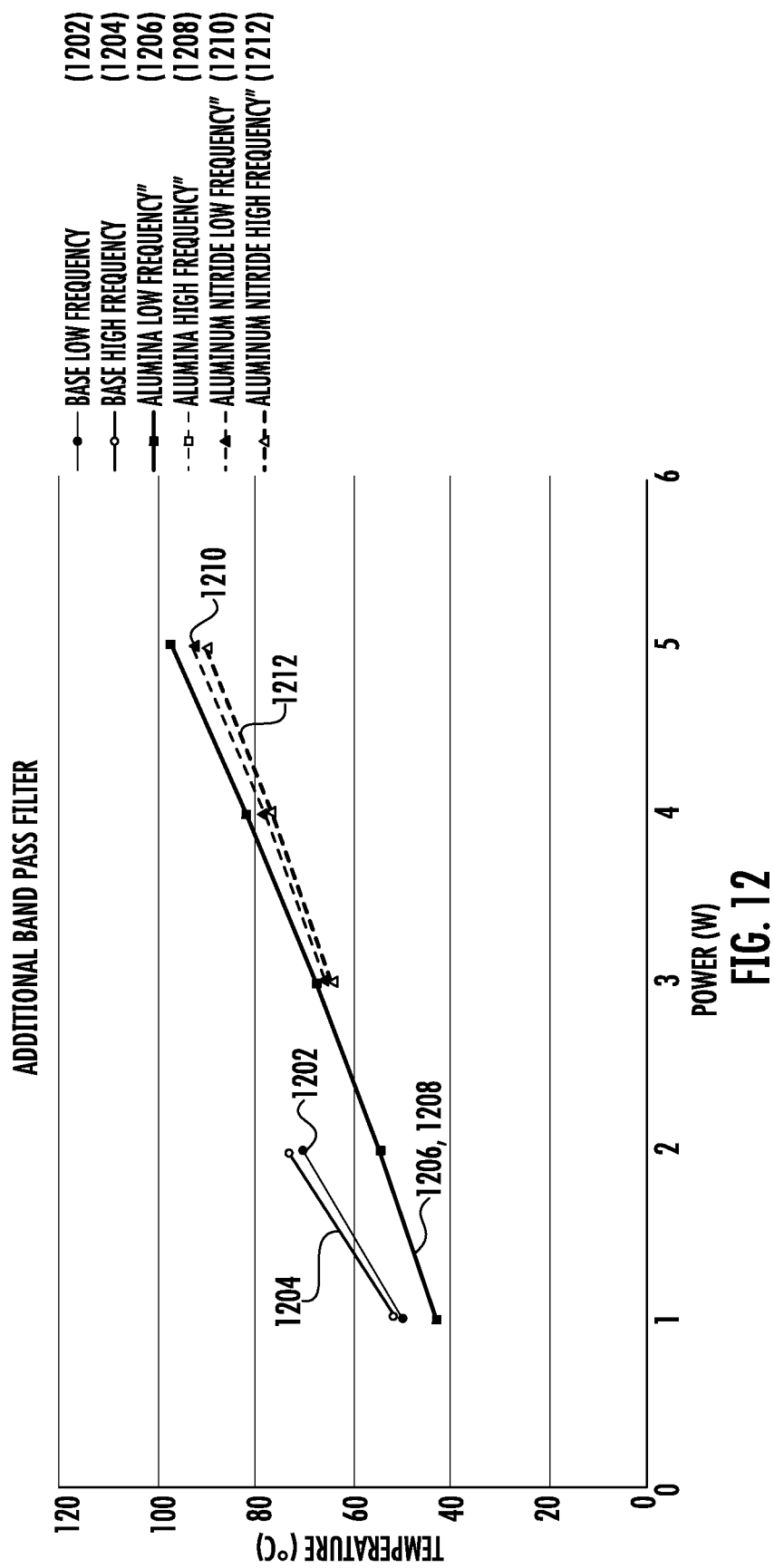

Referring to FIG. 12, an additional filter assembly was subjected to various sinusoidal signals having respective root-mean-square power levels as indicated on the horizontal axis until the filter assembly reached a steady state temperature for each power level. The steady state temperature (represented on the vertical axis) was measured at each power level.

Note that the filter assemblies including heat sinks produce far lower steady state temperatures for a given power level. Thus, filters assemblies including heat sinks according to aspects of the present disclosure can safely operate at higher power levels than filter assemblies without any heat sinks. Additionally, the steady state temperature generally varies little between "low" and "high" frequency signals.

The results of additional power capacity testing are shown below in the "Examples" section.

V. Electrical Simulations and Testing

A. Testing Assembly

Figure 13:
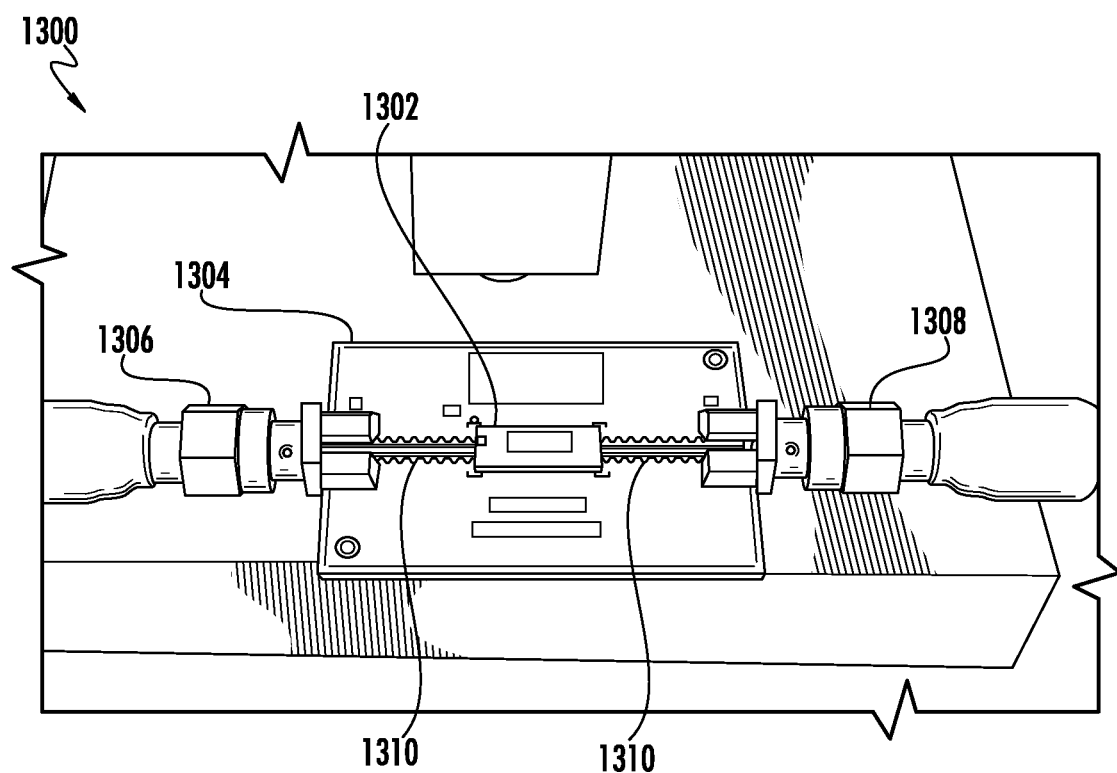
FIG. 13 is a perspective view of a testing assembly including a filter assembly according to aspects of the present disclosure.

Various filter assemblies were tested using a testing assembly. Referring to FIG. 13, the testing assembly 1300 includes a filter assembly 1302 mounted to a test board 1304. An input line 1306 and an output line 1308 were each connected with the test board 1304. The test board 1304 includes microstrip lines 1310 electrically connecting the input line 1306 with an input of the filter assembly 1302 and electrically connecting the output line 1308 with an output of the filter assembly 1302. An input signal was applied to the input line using a source signal generator (e.g., a 1306 Keithley 2400 series Source Measure Unit (SMU), for example, a Keithley 2410-C SMU) and the resulting output of the filter assembly 1302 was measured at the output line 1308. This was repeated for various configurations of the filter assembly. The filter assembly 1302 illustrated in FIG. 13 does not include a heat sink layer. However, various tests were conducted on filter assemblies including heat sink layers of different thicknesses and materials, including alumina and aluminum nitride.

B. Performance Characteristics and Effect of Heat Sink

The filter assembly can have excellent performance characteristics. Additionally, it was empirically determined that adding a sufficiently thin layer of thermally conductive material to a filter assembly, according to aspects of the present disclosure, did not substantially adversely affect the performance characteristics of the filter assembly. The insertion loss and return loss of various filter assemblies with and without heat sink layers were empirically measured. FIG. 14 illustrates both the insertion loss ($S_{2,1}$) and return loss ($S_{1,1}$) of a filter assembly both with and without a heat sink. In this experiment, the thickness of the layer of thermally conductive material was 0.508 mm. While a filter assembly having a layer of alumina and a filter assembly having a layer of aluminum nitride were separately tested, the results were substantially similar and are represented by a single line for insertion loss (labeled "$S_{2,1}$ Heat Sink" in FIG. 14) and a single line for return loss (labeled "$S_{1,1}$ Heat Sink"). The filter assembly without a heat sink (represented by "$S_{1,1}$ AIR" in FIG. 13) had a pass band range from about 225 MHz to about 300 MHz. It was determined that an upper bound of the pass band range was minimally shifted lower by about 1.2% as a result of adding a heat sink including a layer of thermally conductive material to the filter assembly. The lower bound was substantially unaffected by the heat sink layer.

Additionally, the filter assemblies including a heat sink layer exhibited a very slight degradation in return loss, $S_{2,1}$. As noted in FIG. 14, at about 300 Hz, the return loss increased from −11.96 dB to −10.73 dB as a result of the addition of the heat sink layer.

The following table presents measured characteristics of the average insertion loss in the band pass range of the filter assemblies for each heat sink material:

TABLE 4

Effect of Heat Sink on Insertion Loss and Return Loss

|  | Air/No Heat Sink (dB) | Aluminum Nitride (dB) | Alumina (dB) |
|---|---|---|---|
| Pass Band ($S_{2,1}$) | | | |
| 219 MHz | −2.55 | −2.54 | −2.53 |
| 332 MHz | −2.5 | −2.58 | −2.59 |
| Rejection ($S_{2,1}$) | | | |
| 166 MHz | −39.5 | −38.7 | −38.6 |
| 419 MHz | −40.3 | −41.8 | −41.9 |
| Return Loss ($S_{2,2}$) | | | |
| 219 MHz | −13.3 | −13.2 | −13.2 |
| 332 MHz | −15.0 | −15.0 | −15.1 |

Generally, the filter assembly provides excellent electrical characteristics. For example, the insertion loss for frequencies within the pass band is low, greater than −2.5 dB. Additionally, the filter assembly exhibits excellent rejection of frequencies outside the pass band frequency range, as shown above in Table 4 and in FIG. 14.

Referring to FIG. 14, the filter assembly also exhibits steep roll-off from the passband frequency range. In other words, the insertion loss decreases rapidly for frequencies outside the pass band range. For frequencies less than the lower bound of the pass band frequency range, 219 MHz, the insertion loss drops at an average rate of about 0.68 dB/MHz to −39 dB at about 165 Mhz. For frequencies greater than the upper bound of the pass band frequency range, 332 MHz, the insertion loss drops at an average rate of about 0.45 dB/MHz to about −42 dB at about 420 MHz. This steep roll off provides excellent isolation of the pass band frequencies.

Additionally, in some embodiments, the thickness of the layer of thermally conductive material may be selected to selectively tune one or more performance characteristics of the filter assembly. For example, the performance characteristic may include at least one of a pass band frequency range, an insertion loss associated with the pass band frequency range, or a return loss. For instance, based on the measured shift in pass band frequency range and/or return loss discussed above, the thickness can be selected to purposefully tune or adjust the pass band frequency range and/or return loss according to a desired value. Because relatively large changes in the thickness of the layer of thermally conductive material may produce relatively small changes in the performance characteristics, the thickness of the layer may be selected to precisely tune one or more performance characteristics of the filter assembly as needed.

C. Electrical Shielding Effect of Heat Sink

It was determined that the heat sink can provide beneficial electrical shielding. Various filter assemblies were tested with conductive structures arranged proximate the filter assemblies to detect the effect of such structures on the performance characteristic of the filter assemblies. It was determined that the heat sink layer can significantly protect the filter assembly from performance degradation caused by nearby objects.

Figure 15A:
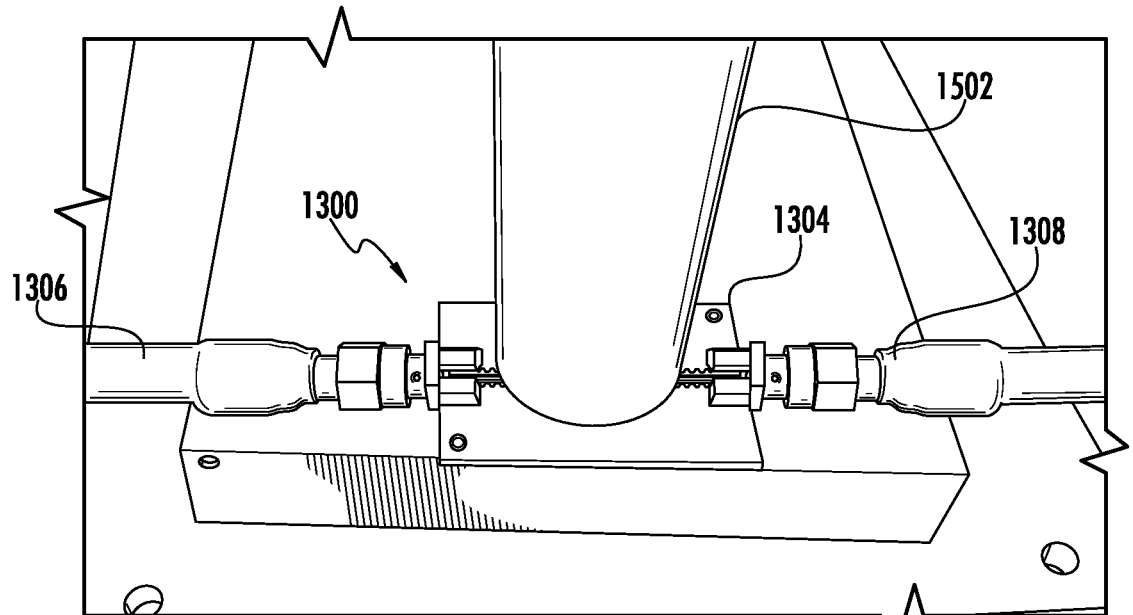
FIGS. 15A and 15B are perspective views of a large metal cylinder and a large metal plane, respectively, arranged proximate the filter assembly for measuring electrical interference caused by the cylinder and plane.
Figure 15B:
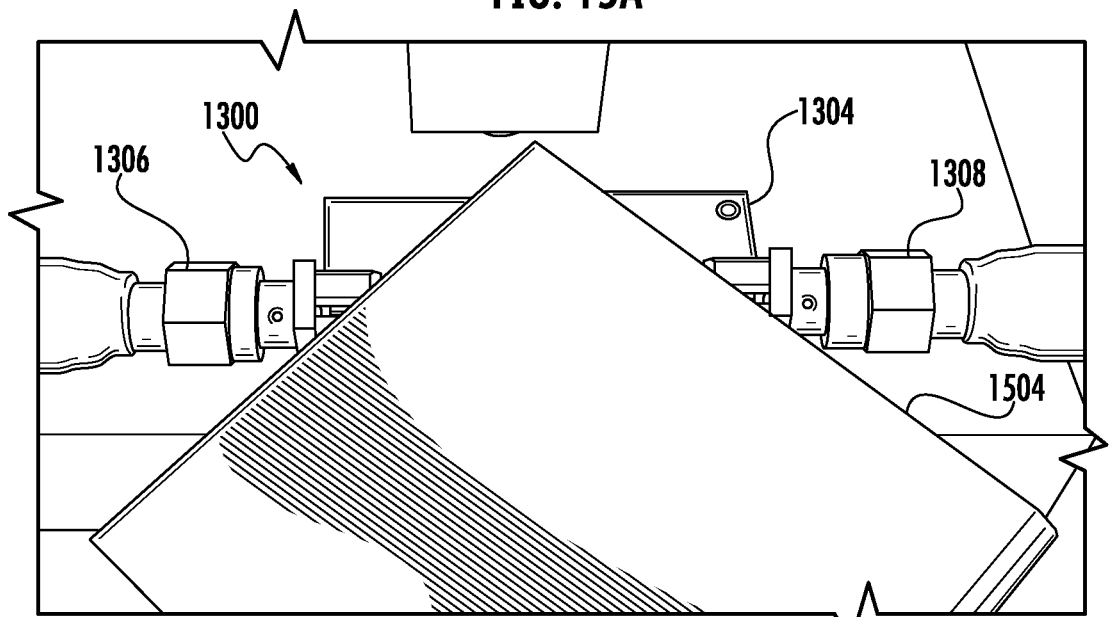

FIGS. 15A and 15B illustrate a large metal cylinder 1502 and a large metal plane 1504, respectively, arranged proximate the filter assembly (obscured by the cylinder 1502 and plane 1504). An input signal was applied to the input line and the resulting output of the filter assembly 1302 was measured at the output line 1308 using a source measure unit (e.g., a 1306 Keithley 2400 series Source Measure Unit (SMU))).

Figure 16A:
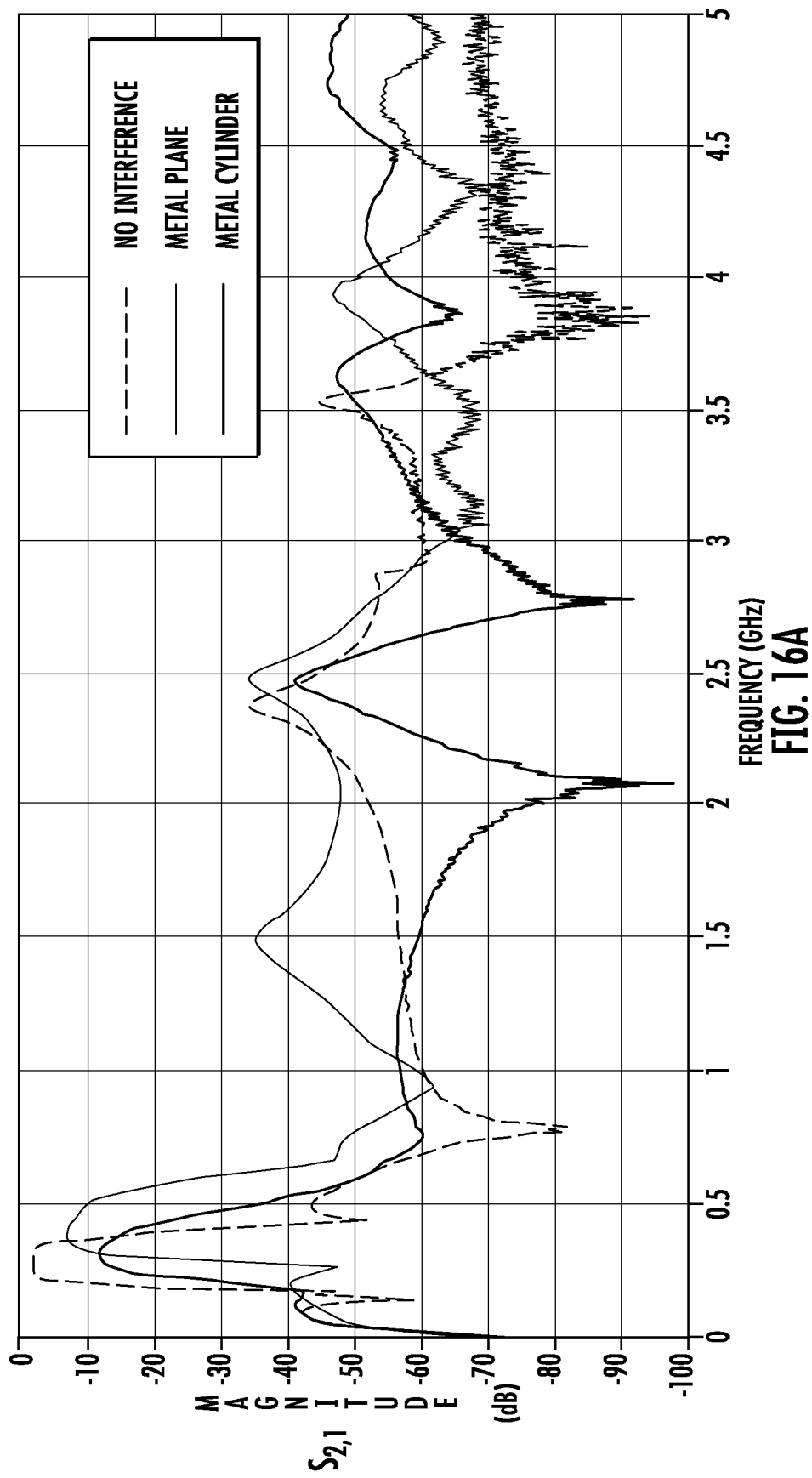
FIG. 16A is a plot of the insertion loss of the filter assembly when the large metal cylinder and large metal plane of FIGS. 15A and 15B are arranged proximate a filter assembly that does not include a heat sink.
Figure 16B:
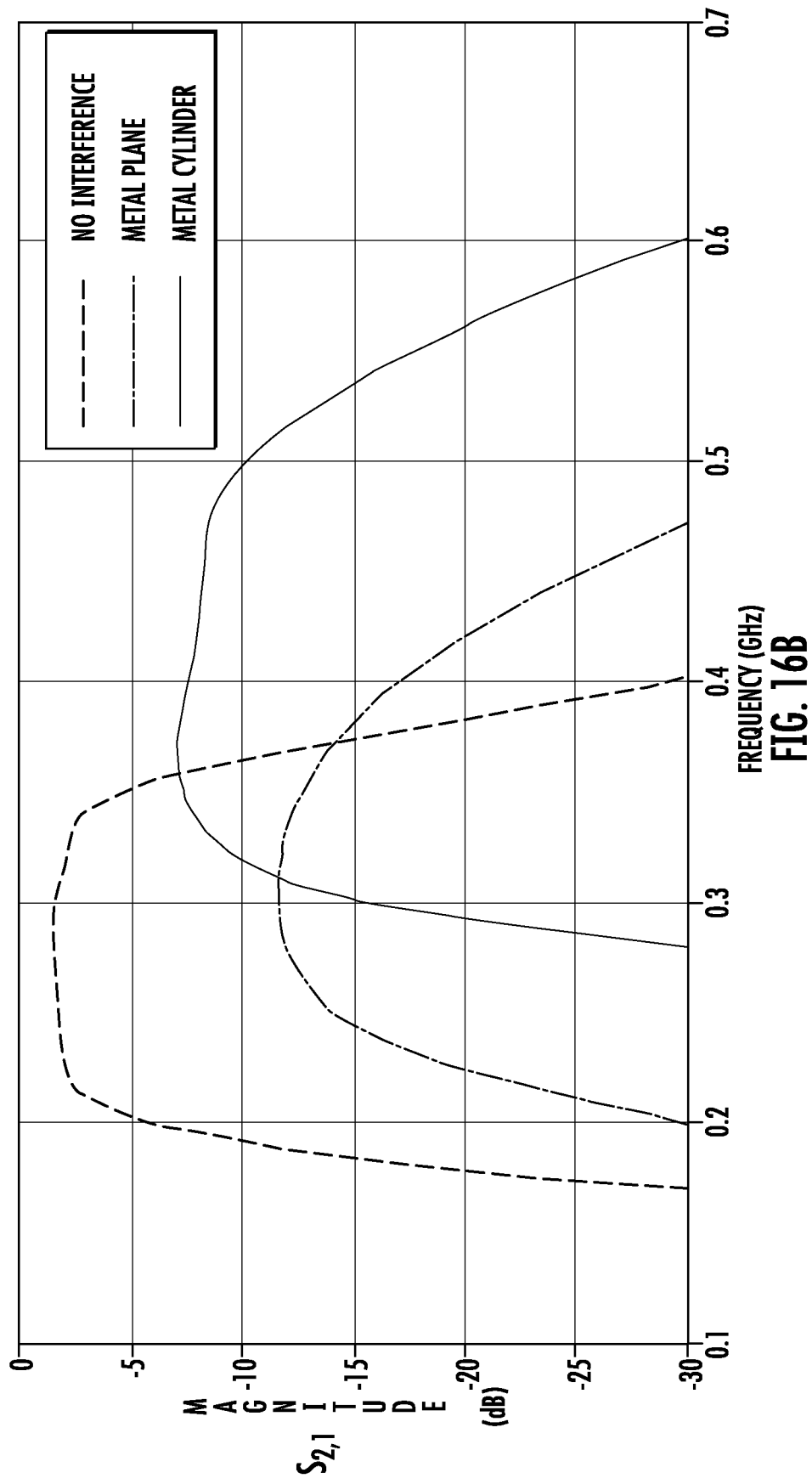
FIG. 16B is an enlarged portion of FIG. 16A showing the effect on the pass band range caused by electrical interference caused by the large metal cylinder and large metal plane.

FIGS. 16A and 16B illustrate the degradation of performance for a filter assembly that does not include a heat sink layer that is caused by the cylinder 1502 and the plane 1504. For reference, the dashed line is a baseline insertion loss when no objects are near the filter assembly to produce electrical interference. As best seen in FIG. 16B, the metal plane 1504 causes the insertion loss in the band pass range to decrease from about −2 dB to about −12 dB. Similarly, the metal cylinder 1502 causes the insertion loss in the band pass range to decrease from about −2 dB to about −7 dB.

Additionally, each of the metal plane and metal cylinder undesirably cause a shift in the pass band frequency range of the filter assembly. With no interference, the pass band ranges from about 225 MHz to about 300 MH. The metal plane caused the pass band range to increase to a range of about 275 MHz to about 330 MHz. Similarly, the metal cylinder caused the pass band range to increase to a range of about 350 MHz to about 480 MHz.

Figure 17A:
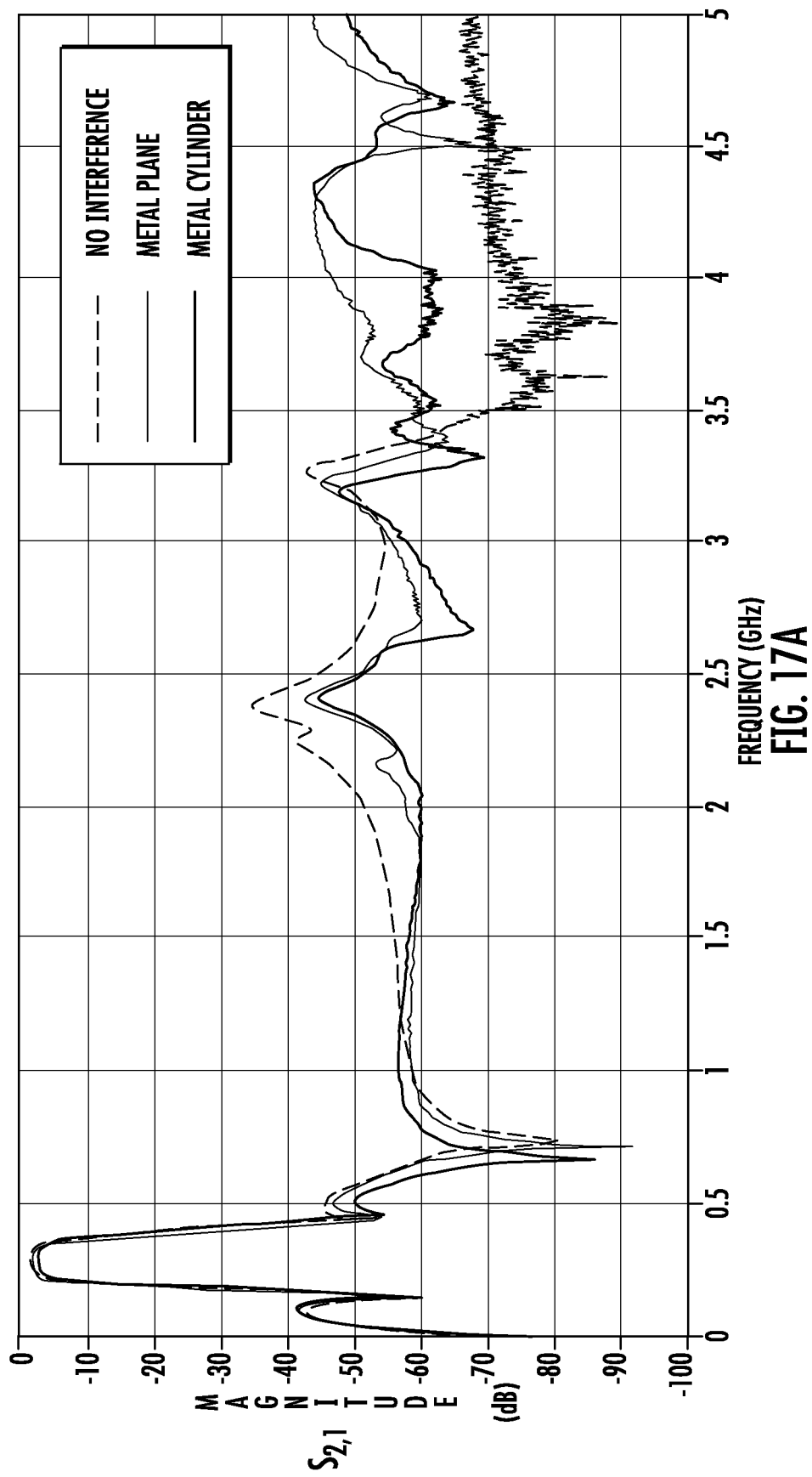
FIG. 17A is a plot of the insertion loss of the filter assembly when the large metal cylinder and large metal plane are arranged proximate a filter assembly that include a heat sink according to aspects of the present disclosure.
Figure 17B:
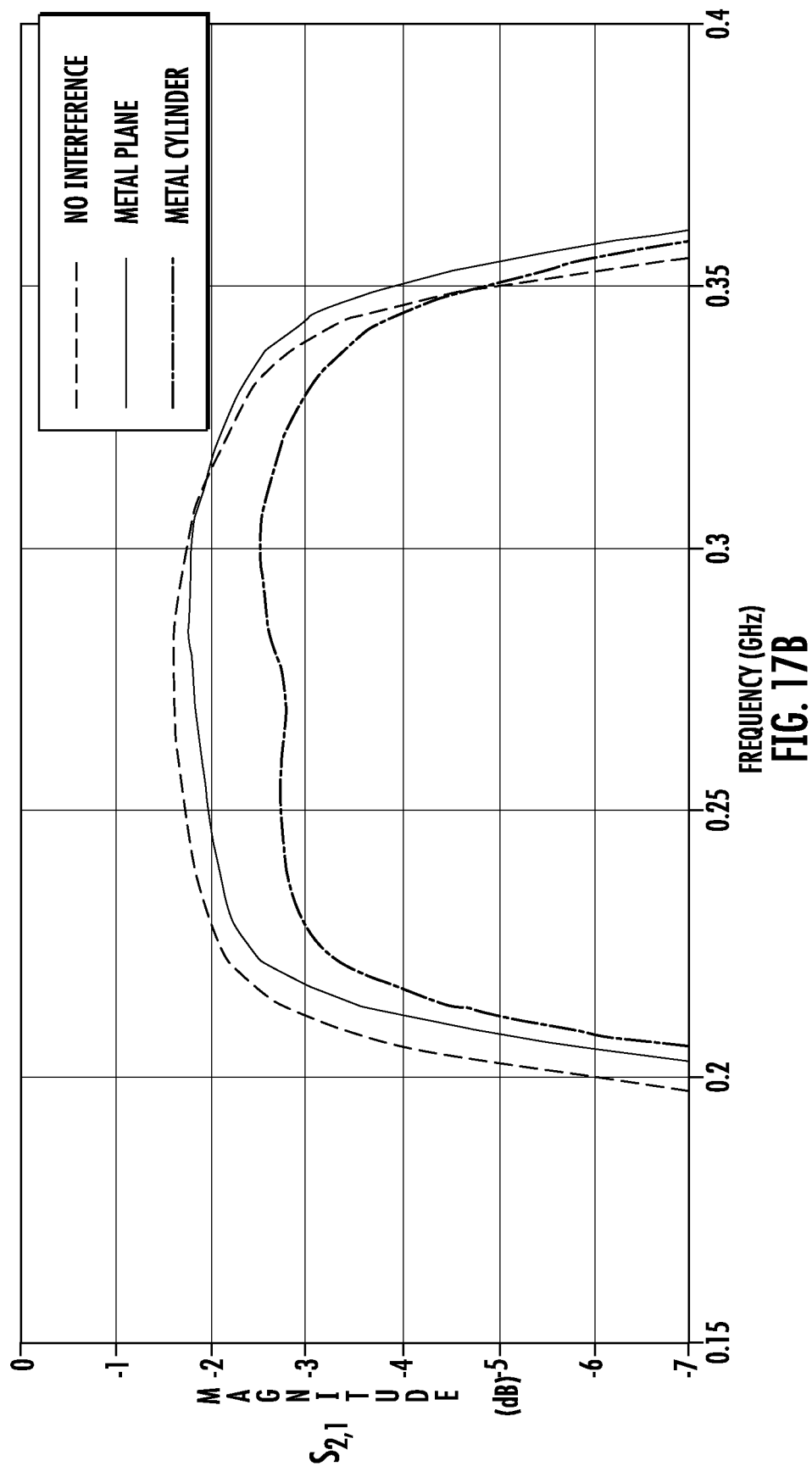
FIG. 17B is an enlarged portion of FIG. 17A showing the shielding effect of the heat sink on the pass band range of the filter assembly.

FIGS. 17A and 17B illustrate the electrical shielding effect of a heat sink including a layer of thermally conductive material. More specifically, insertion loss is plotted on the vertical axis and frequency is plotted on the horizontal axis. A filter assembly including a layer of alumina having a thickness of 0.406 mm was tested as described above with regards to FIGS. 15A through 15B. As best seen in FIG. 17B, the insertion loss is only slightly decreased by the presence of the plane and cylinder. The plane causes the insertion loss to decrease from about −1.5 dB to about −1.75 dB. Similarly, the cylinder causes the insertion loss to decrease from about −1.5 dB to about −2.5 dB. These decreases are significantly smaller than those measured for a filter assembly without a heat sink (as described above with reference to FIGS. 16A and 16B). Thus, the heat sink may provide a significant and desirable electrical shielding effect.

D. Temperature Stability

As indicated above, filter assemblies according to aspects of the present disclosure may exhibit excellent temperature stability. For example, the insertion loss of a filter assembly according to aspects of the present disclosure can vary less than 5 dB or less across large temperature ranges. Testing results are presented in the "Examples" section below and discussed with reference to FIGS. 19A through 19C.

VI. Additional Embodiments

In some embodiments, filter assembly may include multiple monolithic filters according to aspects of the present disclosure. For example, referring to FIG. 18A, in some embodiments, a filter assembly 1800 may include a first monolithic filter 1802 and a heat sink 1804 including layer 1806 of thermally conductive material. The filter assembly 1800 may also include a second (additional) monolithic filter 1808 coupled to the layer 1806 of thermally conductive material of the heat sink 1804 in a stacked arrangement. The layer 1806 may have a first surface 1810 and a second surface 1812 that is opposite the first surface 1810. The first monolithic filter 1802 may have a top surface 1813. The top surfaced 1813 of the first monolithic filter 1802 may be coupled to the first surface 1810 of the layer 1806 of thermally conductive material. The second (additional) monolithic filter 1808 may have a bottom surface 1815 that is coupled to the second surface 1812 of the layer 1806 of thermally conductive material. For example, the filters 1802, 1808 may be coupled to the layer 1806 of thermally conductive material using respective layers of adhesive 1814, 816. One or more connection points 1818 may be provided along a bottom surface 1817 of the first monolithic filter 1802 for electrically connecting the first monolithic filter 1802 with a mounting surface, such as a printed circuit board. For example, solder 1819 may be used to connect the connection points 1818 with various pads or connections on the printed circuit board. In some embodiments, the second monolithic filter 1808 may also include one or more connection points 1820 (e.g., wire bond pads) arranged on a top surface 1821 of the second (additional) monolithic filter 1808. The connection points 1820 may be soldered (represented by solder 1822) to electrical leads to electrically connect the second monolithic filter 1808 with the printed circuit board or another device or component.

FIG. 18B is a simplified side elevation view of a filter assembly 1850 that is generally configured similarly to the filter assembly 1800 described above. The filter assembly 1850 may additionally include one or more vias 1824 that extend from the second (additional) monolithic filter 1808 through the heat sink 1804 to the first monolithic filter 1802 to electrically connect the second filter 1808 with the first filter 1802 and/or with one or more connection points 1818 on the bottom surface 1817 of the first filter 1802. For example, the second filter 1808 may be connected in series or parallel with the first filter 1802. In other embodiments, the second filter 1808 and first filter 1802 may effectively function as a single filter. For example, the first filter 1802 may be configured as a low pass filter, and the second filter 1808 may be configured as a high pass filter, such that the filters 1802, 1808 may act as a band pass filter when connected together (e.g., in series). In some embodiments, the filter assembly 1850 may be free of electrical connections on the top surface 1821 of the second (additional) monolithic filter 1808. In some embodiments, a second layer of the thermally conductive material may be coupled to the top surface 1821 of the second monolithic filter 1808. Further, in some embodiments the second layer of the thermally conductive material may include thermal fins, similar to the thermal fins 511 described above with reference to FIGS. 5A and 5B.

Figure 18C:
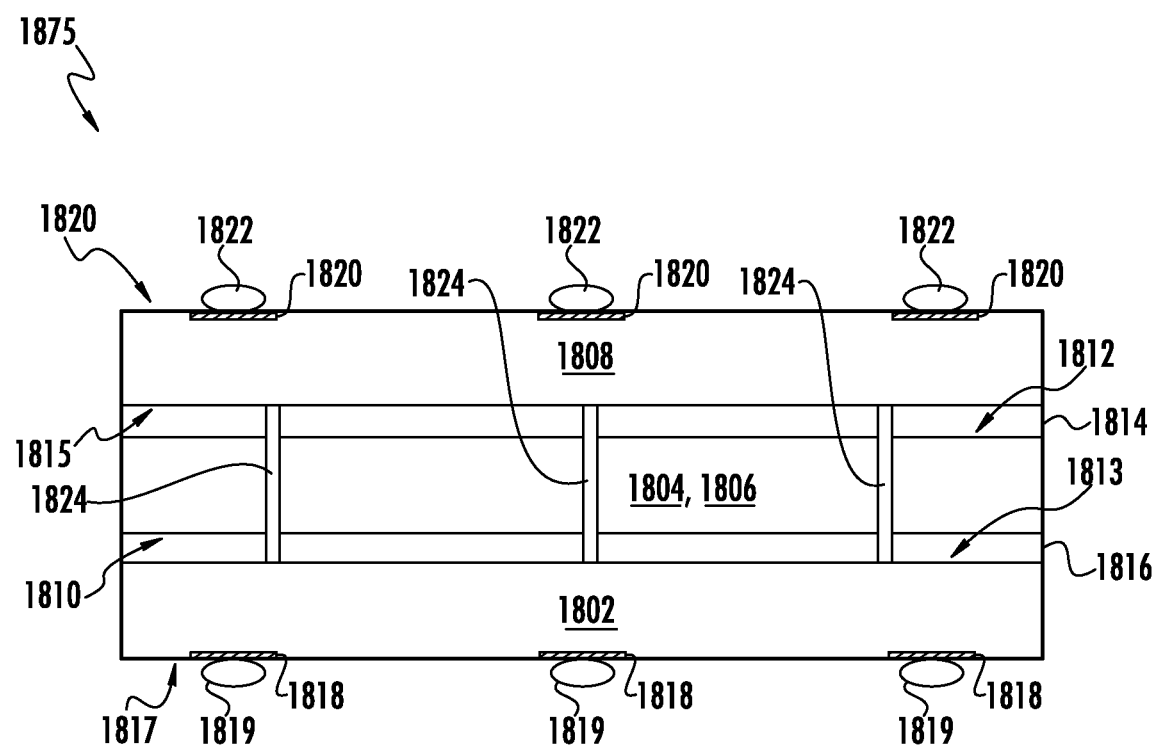

FIG. 18C is a simplified side elevation view of a filter assembly 1875 that is generally configured similarly to the filter assembly 1850 described above but may additionally include connection points 1820 (e.g., wirebond pads) on the top surface 1820 of the second filter 1808.

VII. Applications

The various embodiments of the filter assembly described herein may find application in any suitable type of electrical component. The filter assembly may find particular application in devices that receive, transmit, or otherwise employ high frequency radio signals. Example applications include smartphones, signal repeaters (e.g., small cells), relay stations, and radar.

Test Methods

The following section provides example methods for testing various characteristics of a filter assembly according to aspects of the present disclosure.

Power Capacity

The power capacity of the filter assembly can be defined as the power level that produces a steady state temperature of about 85° C. The power capacity can be measured using a Keithley 2400 series Source Measure Unit (SMU), for example, a Keithley 2410-C SMU. The filter assembly may be mounted to a test assembly as described above with reference to FIG. 13.

The filter assembly may be subjected to a sinusoidal input signal at a variety of frequencies and amplitudes. The temperature of the filter assembly may initially be typical room temperature (24.8° C.). The sinusoidal input signal may be applied at a test frequency. Example test frequencies include 113 MHz, 350 MHz, and 2,325 MHz.

Each filter assembly was subjected to a steady state power level (e.g., about 300 MHz sinusoidal signal with a root-mean-square power of 1 W) until the filter assembly reached a steady state temperature. The power level was then increased by a fixed step amount (e.g., 1 W) and maintained at the new higher power level (e.g., about 300 MHz sinusoidal signal with a root-mean-square power of 2 W, 3 W, 4 W, etc.). This process was repeated until the steady state temperature of the filter assembly was about 85° C. The applied power at that point is considered the power capacity of the filter. The above procedure may be repeated using a variety of frequencies to establish the power capacity of the filter assembly across a range of frequencies, if desired.

The area power capacity may be calculated by dividing the measured power capacity of the filter assembly by the area or footprint of the surface-mount component.

Insertion Loss

Insertion loss can be measured using a Keithley 2400 series Source Measure Unit (SMU), for example, a Keithley 2410-C SMU. The filter assembly may be mounted to a test assembly as described above with reference to FIG. 13. An input of the filter assembly may be subjected to a sinusoidal input signal at a variety of frequencies and amplitudes. An output signal of the filter assembly can be measured at an output of the filter assembly. An amplitude of the output can be compared with the input signal to calculate the insertion loss.

EXAMPLES

The following table presents the power capacity of various filter assemblies tested according to the above-described method of measuring power capacity at a variety of test frequencies as listed below:

TABLE 5

Power Capacity Test Results

| Test Freq. (MHz) | Power Capacity (W) | | | Max. Temp. at 5 W (° C.) | Dimensions | | | Area (mm$^2$) | Power Capacity (W/mm$^2$) |
| | Without Heat Sink | Alumina Heat Sink | Aluminum Nitride Heat Sink | | L (mm) | W (mm) | T (mm) | | |
| --- | --- | --- | --- | --- | --- | --- | --- | --- | --- |
| 110 | 2 | 5 | 6 | | 15.24 | 6.35 | 1.51 | 96.8 | 0.062 |
| 180 | 1 | 5 | 6 | | 15.24 | 6.35 | 1.42 | 96.8 | 0.062 |
| 300 | 1 | 4 | 4 | 102 | 11.68 | 4.32 | 1.39 | 50.5 | 0.079 |
| 630 | 1 | 4 | 4 | 102 | 11.68 | 4.32 | 1.40 | 50.5 | 0.079 |
| 850 | 2 | 5 | 5 | | 10.20 | 3.98 | 1.00 | 40.6 | 0.123 |
| 1150 | 2 | 4 | 4 | 97 | 8.67 | 3.98 | 1.37 | 34.5 | 0.116 |
| 1550 | 2 | 5 | 5 | | 8.67 | 3.98 | 1.33 | 34.5 | 0.145 |
| 2150 | 3 | 5 | 5 | | 7.79 | 3.98 | 1.11 | 31.0 | 0.161 |

The thickness values presented in Table 5 include the thickness of the layer of thermally conductive material of the heat sink, which was 0.508 mm (0.02 in) for these components.

A comparative test was conducted between a filter lacking a heat sink and a filter having a heat sink including a layer of alumina with a thickness of 0.406 mm (0.016 in) according to aspects of the present disclosure. The filters had a length of 9.14 mm (0.360 in) and a width of 4.42 mm (0.174 in). The following table presents the maximum temperature of each filter at increasing power levels ranging from 5 W to 25 W at about 300 MHz.

TABLE 6

Comparative Power Test Results for Alumina Heat Sink at about 300 MHz

| Power (W) | Temperature without Heat Sink (° C.) | Temperature with Alumina Heat Sink (° C.) |
| --- | --- | --- |
| 5 | 103 | 63.4 |
| 6 | 117 | 71.6 |
| 7 | 131 | 80.2 |
| 8 | 145 | 88.4 |
| 9 | 160 | 96.6 |
| 10 | 174 | 106 |
| 11 | 188 | 113 |
| 12 | 206 | 123 |
| 13 | 223 | 133 |
| 14 | 242 | 140 |
| 15 | 261 | 149 |
| 16 | 280 | 160 |
| 17 | 297 | 170 |
| 18 | 318 | 180 |
| 19 | 339 | 191 |
| 20 | 359 | 201 |
| 21 | >360 | 213 |
| 22 | >360 | 222 |
| 23 | >360 | 234 |
| 24 | >360 | 244 |
| 25 | >360 | 255 |

The filter including a layer of alumina operated at lower temperatures for each given power level. Similarly, at a given temperature, the filter including a layer of alumina operated at a higher power level. For example, for a maximum acceptable operating temperature of about 200° C., the filter including a layer of alumina operated at a power level of about 20 W, while the filter without a heat sink operated at a power level of about 12 W.

The filter having a heat sink including a layer of alumina with a thickness of 0.406 mm (0.016 in) was also subjected to power levels ranging from 3 W to 13 W at about 225 MHz. The following table presents the results:

TABLE 6

Power Test Results for Alumina Heat Sink at about 225 MHz

| Power (W) | Temperature (° C.) |
| --- | --- |
| 3 | 70.2 |
| 4 | 85.9 |
| 5 | 102 |
| 6 | 121 |
| 7 | 141 |
| 8 | 167 |
| 9 | 195 |
| 10 | 227 |
| 11 | 259 |
| 12 | 296 |

The filter exceeded 200° C. between 9 W and 10 W. Failure was observed at a power level between 12 W and 13 W.

A filter having a heat sink including a layer of alumina with a thickness of 0.406 mm (0.016 in) was also subjected to power levels ranging from 3 W to 17 W at about 500 MHz. The following table presents the results:

TABLE 7

Power Test Results for Alumina Heat Sink at about 500 MHz

| Power (W) | Temperature (° C.) |
|---|---|
| 3 | 69.7 |
| 4 | 85 |
| 5 | 102 |
| 6 | 120 |
| 8 | 160 |
| 10 | 199 |
| 11 | 216 |
| 12 | 236 |
| 13 | 263 |
| 14 | 288 |
| 15 | 302 |
| 16 | 314 |

The filter exceeded 200° C. between 10 W and 11 W. Failure was observed between 16 W and 17 W.

As indicated above, filters according to aspects of the present disclosure may exhibit excellent temperature stability. The insertion loss characteristics of several filters according to aspects of the present disclosure were built and tested. The filters included heat sinks that each included a layer of alumina with a thickness of 0.406 mm (0.016 in). The filters had a length of 9.14 mm (0.360 in) and a width of 4.42 mm (0.174 in).

Figure 19A:
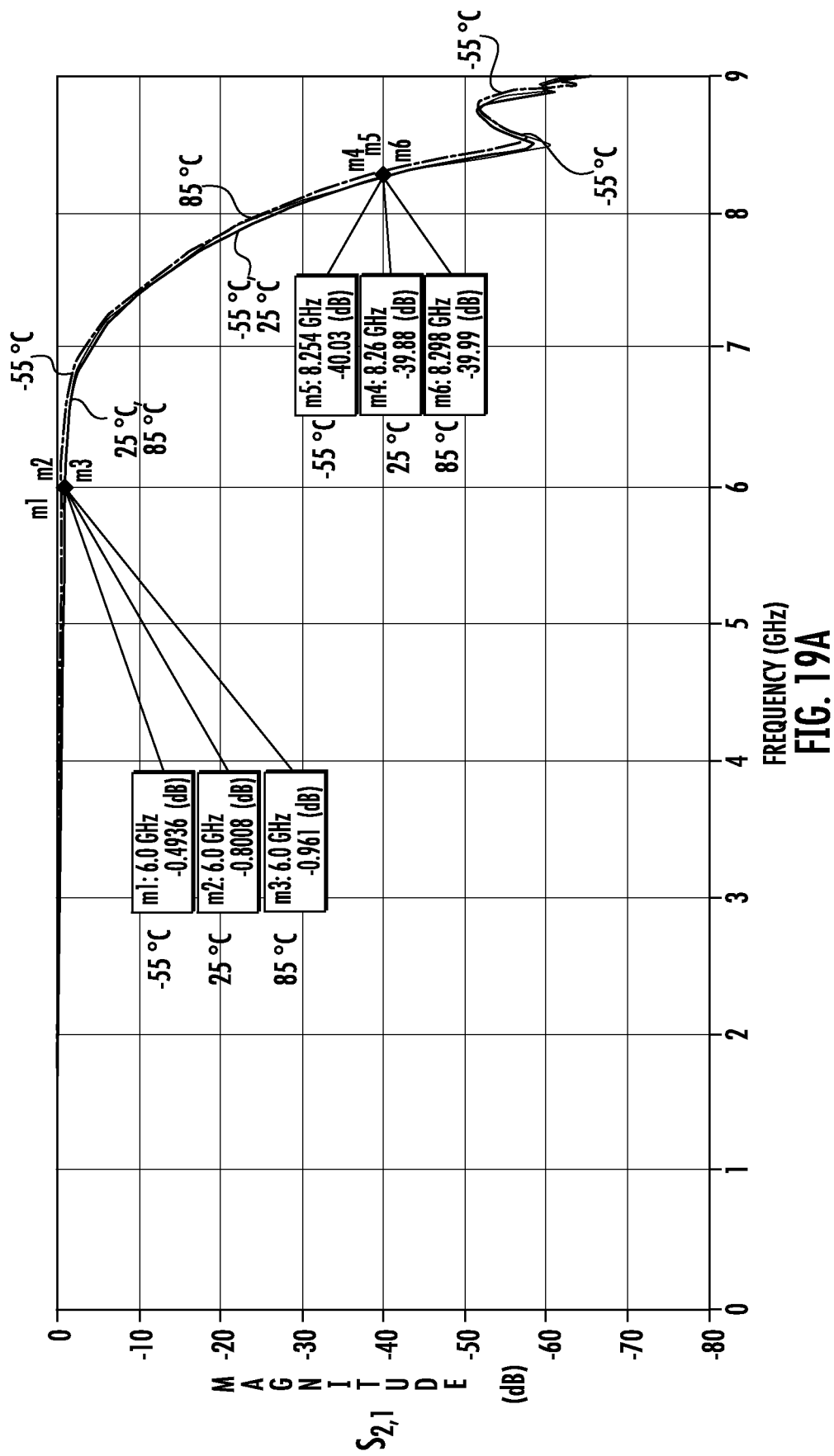
FIG. 19A is an insertion loss plot for a low pass filter assembly according to aspects of the present disclosure measured at −55° C., 25° C., and 85° C.

FIG. 19A is an insertion loss plot for a low pass filter assembly that was measured at −55° C., 25° C., and 85° C. As shown in FIG. 19A, insertion loss measurements of the filter at three test temperatures were substantially identical. For example, the insertion loss of the filter was substantially identical between the three test temperatures at about 6 GHz and at about 8.3 GHz. The insertion loss values measured at each temperature and frequency are listed in the below table:

TABLE 8

Low Pass Filter #1, Insertion Loss Temperature Stability

| Temperature (° C.) | Frequency (GHz) | Insertion Loss (dB) | Insertion Loss Difference with Measurement at 25° C. (dB) |
|---|---|---|---|
| −55 | 6.0 | −0.494 | 0.307 |
| 25 | 6.0 | −0.801 | — |
| 85 | 6.0 | −0.961 | 0.160 |
| −55 | 8.254 | −40.03 | 0.15 |
| 25 | 8.26 | −39.88 | — |
| 85 | 8.298 | −39.99 | 0.11 |

Figure 19B:
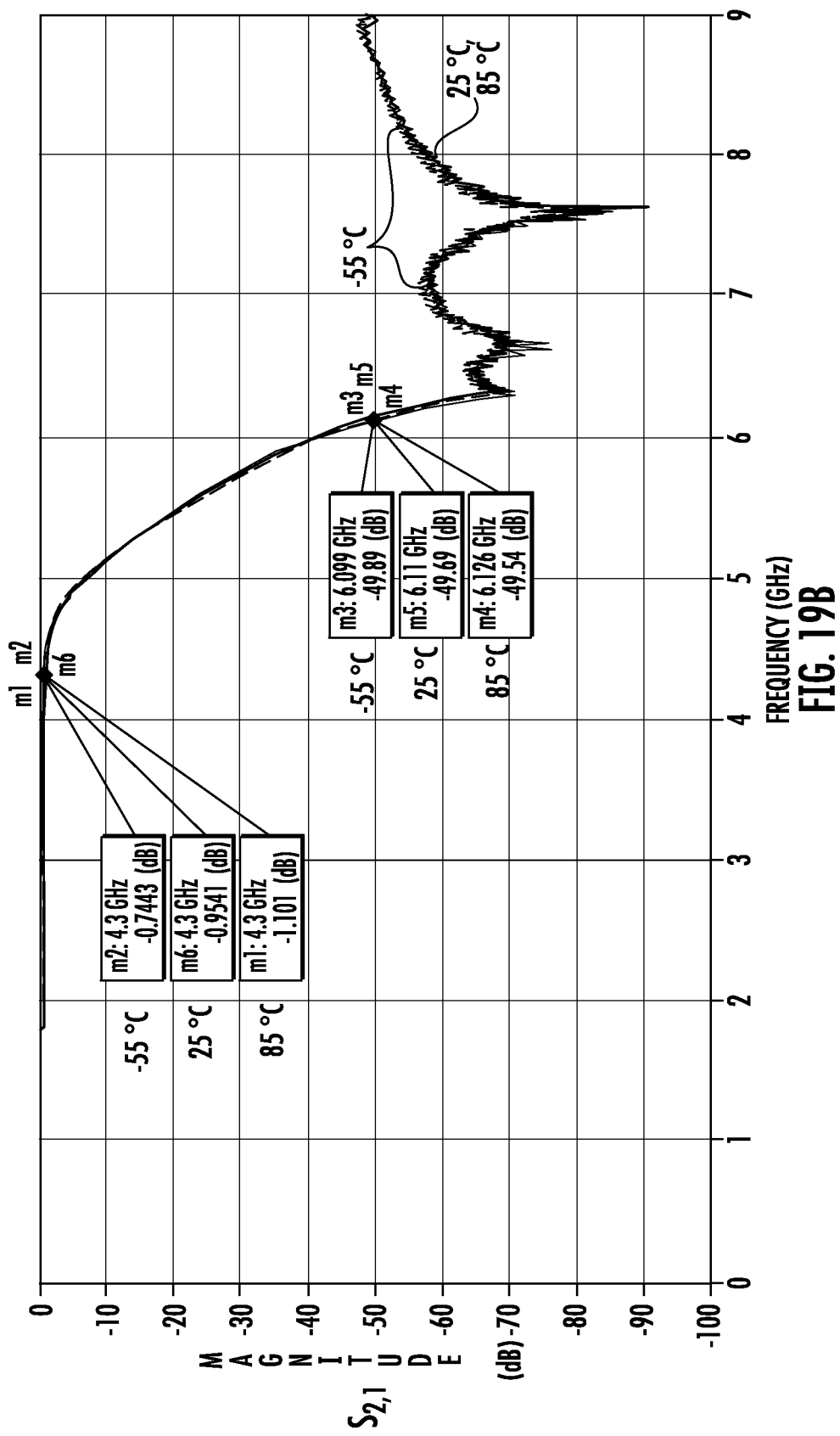
FIG. 19B is an insertion loss plot for another low pass filter assembly according to aspects of the present disclosure measured at −55° C., 25° C., and 85° C.

At about 6 GHz, the insertion loss measurements at −55° C. and 85° C. vary less than 0.31 dB from the insertion loss measurement at 25° C. At about 8.3 GHz, the insertion loss measurements at −55° C. and 85° C. vary less than 0.17 dB from the insertion loss measurement at 25° C. FIG. 19B is an insertion loss plot for another low pass filter assembly according to aspects of the present disclosure measured at −55° C., 25° C., and 85° C. This low pass filter assembly has a cut off frequency of about 5 GHz. As shown in FIG. 19B, the insertion loss of the filter was substantially identical between the three test temperatures. More specifically, the insertion loss values measured at each temperature and frequency are listed in the below table:

TABLE 9

Low Pass Filter #2, Insertion Loss Temperature Stability

| Temperature (° C.) | Frequency (GHz) | Insertion Loss (dB) | Insertion Loss Difference with Measurement at 25° C. (dB) |
|---|---|---|---|
| −55 | 4.3 | −0.744 | 0.210 |
| 25 | 4.3 | −0.954 | — |
| 85 | 4.3 | −1.101 | 0.147 |
| −55 | 6.099 | −49.89 | 0.20 |
| 25 | 6.11 | −49.69 | — |
| 85 | 6.126 | −49.54 | 0.15 |

At about 4.3 GHz, the insertion loss measurements at −55° C. and 85° C. vary less than 0.22 dB from the insertion loss measurement at 25° C. At about 6.1 GHz, the insertion loss measurements at −55° C. and 85° C. vary less than 0.21 dB from the insertion loss measurement at 25° C.

Figure 19C:
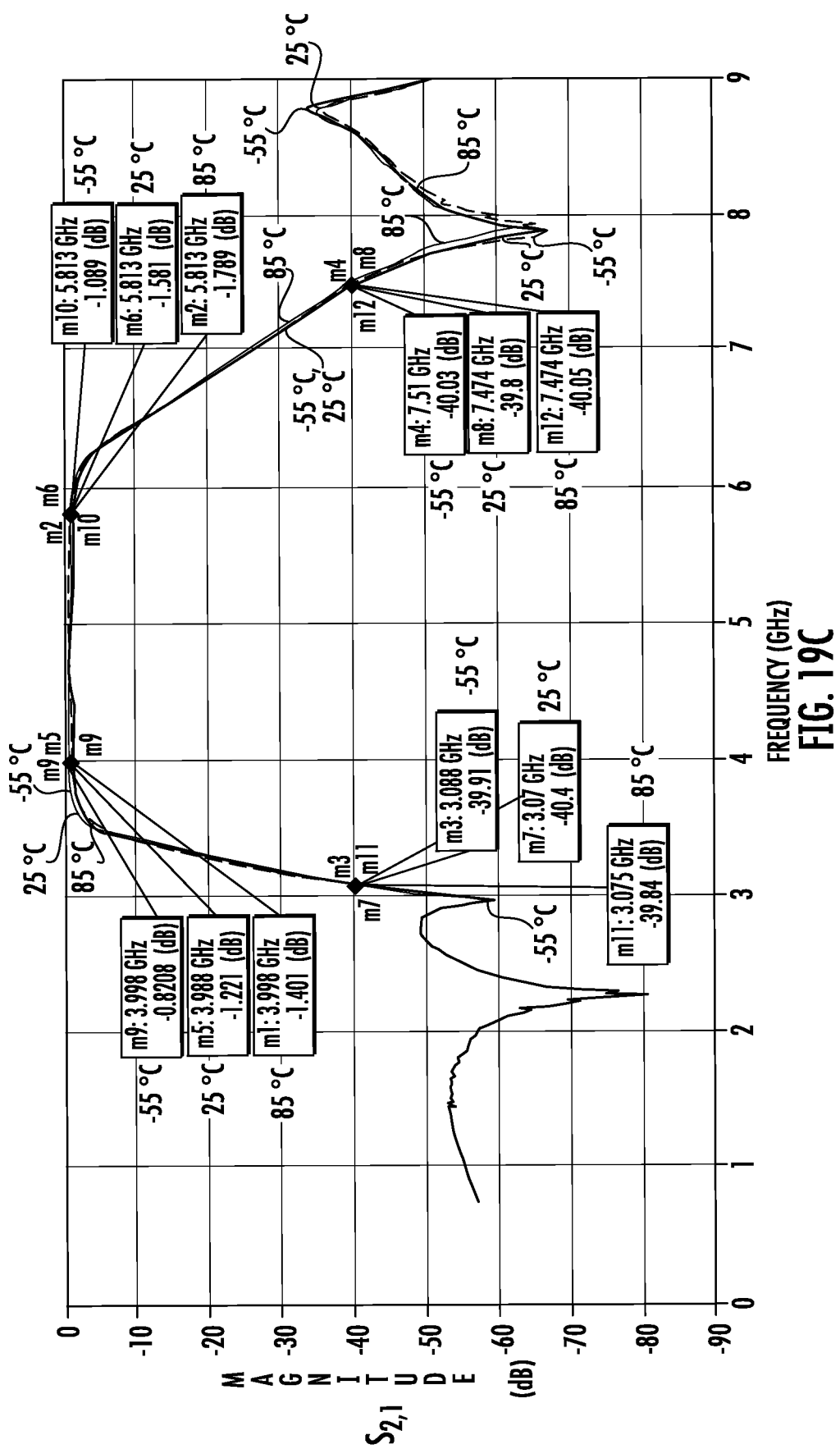
FIG. 19C is an insertion loss plot for a band pass filter assembly according to aspects of the present disclosure measured at −55° C., 25° C., and 85° C.

FIG. 19C is an insertion loss plot for a band pass filter assembly according to aspects of the present disclosure measured at −55° C., 25° C., and 85° C. As shown in FIG. 19C, the insertion loss of the filter was substantially identical across the three test temperatures. More specifically, the insertion loss values measured at each temperature and frequency are listed in the below table:

TABLE 10

Band Pass Filter, Insertion Loss Temperature Stability

| Temperature (° C.) | Frequency (GHz) | Insertion Loss (dB) | Insertion Loss Difference with Measurement at 25° C. |
|---|---|---|---|
| −55 | 3.086 | −39.91 | 0.49 |
| 25 | 3.07 | −40.4 | — |
| 85 | 3.075 | −39.84 | 0.56 |
| −55 | 3.998 | −0.8208 | 0.4 |
| 25 | 3.998 | −1.221 | — |
| 85 | 3.998 | −1.401 | 0.18 |
| −55 | 5.813 | −1.089 | 0.492 |
| 25 | 5.813 | −1.581 | — |
| 85 | 5.813 | −1.789 | 0.208 |
| −55 | 7.51 | −40.03 | 0.23 |
| 25 | 7.474 | −39.8 | — |
| 85 | 7.474 | −40.05 | 0.25 |

At about 3.08 GHz, the insertion loss measurements at −55° C. and 85° C. vary less than 0.6 dB from the insertion loss measurement at 25° C. At about 4.0 GHz, the insertion loss measurements at −55° C. and 85° C. vary less than 0.41 dB from the insertion loss measurement at 25° C. At about 5.8 GHz, the insertion loss measurements at −55° C. and 85° C. vary less than 0.5 dB from the insertion loss measurement at 25° C. At about 7.49 GHz, the insertion loss measurements at −55° C. and 85° C. vary less than 0.3 dB from the insertion loss measurement at 25° C.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multi-layer filter assembly comprising:
a multi-layer filter having a surface; and
a heat sink coupled to the surface of the multi-layer filter, the heat sink comprising a layer of thermally conductive material that has a thickness that is greater than about 0.02 mm,
wherein the filter assembly has an area power capacity greater than about 0.05 W/mm$^2$ at about 300 MHz,
wherein the filter assembly has a first insertion loss greater than −15 dB for frequencies within a frequency range of the filter assembly,
wherein the filter assembly has a second insertion loss less than −15 dB for frequencies outside of the frequency range of the filter assembly,
wherein the multi-layer filter includes an inductor comprising a stitched metal layer building block,
wherein the stitched metal layer building block comprises a first inductor section having a first connection point and a second connection point and a second inductor section having a first connection point and a second connection point,
wherein the first connection point of the first inductor section is stitched to the first connection point of the second inductor section using a first via, and
wherein the second connection point of the first inductor section is stitched to the second connection point of the second inductor section using a second via.

2. The multi-layer filter assembly of claim 1, wherein the multi-layer filter comprises an organic dielectric material.

3. The multi-layer filter assembly of claim 2, wherein the organic dielectric material comprises at least one of liquid crystalline polymer or polyphenyl ether.

4. The multi-layer filter assembly of claim 1, wherein the layer of thermally conductive material comprises alumina.

5. The multi-layer filter assembly of claim 1, wherein the layer of thermally conductive material comprises aluminum nitride.

6. The multi-layer filter assembly of claim 1, wherein the layer of thermally conductive material defines at least one thermal fin.

7. The multi-layer filter assembly of claim 1, wherein the thickness of the layer of thermally conductive material is selected such that performance of the filter assembly is substantially unaffected by the layer of thermally conductive material.

8. The multi-layer filter assembly of claim 1, wherein the layer of thermally conductive material is configured to electrically shield the multi-layer filter.

9. The multi-layer filter assembly of claim 1, further comprising an additional multi-layer filter coupled to the layer of thermally conductive material of the heat sink in a stacked arrangement such that the multi-layer filter is coupled to a first surface of the layer of thermally conductive material, and the additional multi-layer filter is coupled to a second surface of the layer of thermally conductive material that is opposite the first surface of the heat sink.

10. The multi-layer filter assembly of claim 9, wherein the additional multi-layer filter has a top surface and a bottom surface that is opposite the top surface of the additional multi-layer filter, and wherein wirebond pads are arranged on the top surface of the additional multi-layer filter.

11. The multi-layer filter assembly of claim 9, further comprising at least one via extending from the additional multi-layer filter through the heat sink to the multi-layer filter, wherein the additional multi-layer filter is coupled with the layer of thermally conductive material at the bottom surface of the additional multi-layer filter.

12. The multi-layer filter assembly of claim 1, wherein the filter assembly has a power capacity of greater than about 1 W at about 300 MHz.

13. The multi-layer filter assembly of claim 1, wherein the insertion loss at frequencies outside the pass band frequency range decreases at a rate of about 0.1 dB/MHz or greater.

14. The multi-layer filter assembly of claim 1, wherein the stitched metal layer building block is a first stitched metal layer building block, wherein the inductor includes a second stitched metal layer building block connected to the first stitched metal layer building block using at least one connection via, and wherein the second stitched metal layer building block comprises:
a first inductor section having a first connection point and a second connection point, and
a second inductor section having a first connection point and a second connection point, the first connection point of the first inductor section stitched to the first connection point of the second inductor section using a first via of the second stitched metal layer building block, and the second connection point of the first inductor section is stitched to the second connection point of the second inductor section using a second via of the second stitched metal layer building block.

15. A multi-layer organic filter assembly comprising:
a multi-layer organic filter having a first surface and a second surface opposite the first surface along a Z-direction;
a heat sink coupled to the first surface of the multi-layer organic filter, the heat sink comprising a layer of thermally conductive material; and
at least one connection point defined on the second surface of the multi-layer organic filter such that the at least one connection point is defined on the multi-layer organic filter opposite the heat sink,
wherein the at least one connection point is configured to be coupled to a mounting surface of a printed circuit board,
wherein the filter assembly has a first insertion loss greater than −15 dB for frequencies within a frequency range of the filter assembly, and
wherein the filter assembly has a second insertion loss less than −15 dB for frequencies outside of the frequency range of the filter assembly.

16. A multi-layer filter assembly comprising:
a multi-layer filter having a first surface and a second surface opposite the first surface; and
a heat sink coupled to the surface of the multi-layer filter, the heat sink comprising a layer of thermally conductive material;
wherein:
the filter assembly exhibits a first insertion loss at about 25° C. and at a first frequency;
the filter assembly exhibits a second insertion loss at a second temperature and at about the first frequency;
a temperature difference between the first temperature and the second temperature is about 30° C. or greater;
a difference between the second insertion loss and the first insertion loss is about 5 dB or less;
the first insertion loss is greater than −15 dB for frequencies within a frequency range of the filter assembly;

the second insertion loss is less than −15 dB for frequencies outside of the frequency range of the filter assembly;

the filter assembly has an area power capacity greater than about 0.05 W/mm$^2$ at about 300 MHz;

at least one connection point is defined on the second surface of the multi-layer filter; and the at least one connection point is configured to be coupled to a mounting surface of a printed circuit board such that the multi-layer filter is disposed between the heat sink and the mounting surface.

17. The multi-layer filter assembly of claim 16, wherein the second temperature is about 85° C.

18. The multi-layer filter assembly of claim 16, wherein the second temperature is about −55° C.

* * * * *